United States Patent
Tamura et al.

(10) Patent No.: US 6,724,378 B2
(45) Date of Patent: Apr. 20, 2004

(54) DISPLAY DRIVER AND DISPLAY UNIT AND ELECTRONIC APPARATUS UTILIZING THE SAME

(75) Inventors: Tsuyoshi Tamura, Hara-mura (JP); Zenzo Oda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 258 days.

(21) Appl. No.: 10/060,010

(22) Filed: Jan. 29, 2002

(65) Prior Publication Data

US 2002/0113783 A1 Aug. 22, 2002

(30) Foreign Application Priority Data

Feb. 19, 2001 (JP) ........................................ 2001-041762

(51) Int. Cl.$^7$ ................................................ G09G 5/00
(52) U.S. Cl. ........................... 345/204; 345/88; 345/97; 345/98; 345/100; 345/92; 345/95; 345/99; 345/203; 345/204; 345/208; 345/211; 345/213; 365/154; 365/156; 365/185.13; 365/185.01; 365/185.23; 365/189.01; 365/230.01; 365/230.06; 365/220; 365/221; 369/54; 369/58; 369/59; 369/60; 369/176; 369/242
(58) Field of Search ............................ 345/98, 100, 92, 345/95, 99, 97, 88, 203, 204, 208, 213, 211; 365/156, 154, 185.13, 185.01, 185.23, 189.01, 230.01–230.06, 220, 221; 369/54, 58, 59, 60, 176, 242

(56) References Cited

U.S. PATENT DOCUMENTS 5,717,638 A * 2/1998 Kim ........................ 365/189.04
5,812,148 A * 9/1998 Takasugi et al. ............ 345/567
6,025,822 A * 2/2000 Motegi et al. ................ 345/98

* cited by examiner

Primary Examiner—Richard Hjerpe
Assistant Examiner—Jennifer T. Nguyen
(74) Attorney, Agent, or Firm—Hogan & Hartson, LLP

(57) ABSTRACT

There is provided a display driver incorporating a RAM in which a plurality of memory cells having a three-port configuration can be provided within an interval of output electrodes thereof, and a display unit and an electronic apparatus utilizing the same. The memory cells include a flip-flop comprised of first and second inverters. A first node of the flip-flop is connected to a CPU bit line and an RGB bit line through an N-type MOS transistor. A P-type MOS transistor and an N-type MOS transistor are connected to a second node of the flip-flop. The N-type MOS transistor is connected to a ground potential level at the source terminal thereof. A set signal for each pixel is supplied to the gate terminal of only the flip-flop associated with the pixel to be written, and the set signal sets the second node at the ground potential level.

37 Claims, 18 Drawing Sheets ns such as portable telephones and Personal Digital Assistants (PDAs), liquid crystal panels are often used which preferably realize reduced sizes, weights, and power consumption. A display section constituted by such a liquid crystal panel or the like is driven for display by a display driver.

DISPLAY DRIVER AND DISPLAY UNIT AND ELECTRONIC APPARATUS UTILIZING THE SAME

Japanese patent application No. 2001-41762, filed on Feb. 19, 2001 hereby incorporated by reference in its entirety.

TECHNICAL FIELD

The present invention relates to a display driver and a display unit and an electronic apparatus utilizing the same.

BACKGROUND

In display sections of portable electronic apparatus such as portable telephones and Personal Digital Assistants (PDAs), liquid crystal panels are often used which preferably realize reduced sizes, weights, and power consumption. A display section constituted by such a liquid crystal panel or the like is driven for display by a display driver.

To display a still-image or moving-image, a display driver outputs still-image data or moving-image data to a display section in a constant period. Therefore, power consumption is reduced by incorporating a RAM for storing such data in the display driver. For the purpose of further reducing the size, weight, and power consumption of such a display driver, it is considered effective to improve the level of integration by using a miniaturization process.

SUMMARY

One aspect of the invention relates to a display driver incorporating a RAIVI formed of at least a plurality of memory cells provided for each pixel. Each of the memory cells includes a flip-flop having first and second nodes which store logic levels complementary to each other; a first switching element which electrically connects a first bit line with the first node when a first word line becomes active; and a second switching element which electrically connects a second bit line with the first node when a second word line becomes active. Each of the memory cells further includes a setting circuit which sets the second node at a first logic level based on a set signal and a circuit which outputs the logic level stored at the second node to a display read line based on a given read signal. The display driver includes a set signal generation circuit which generates the set signal for each pixel. The set signal sets the second node at the first logic level for the memory cells for a pixel.

DETAILED DESCRIPTION

Figure 1:
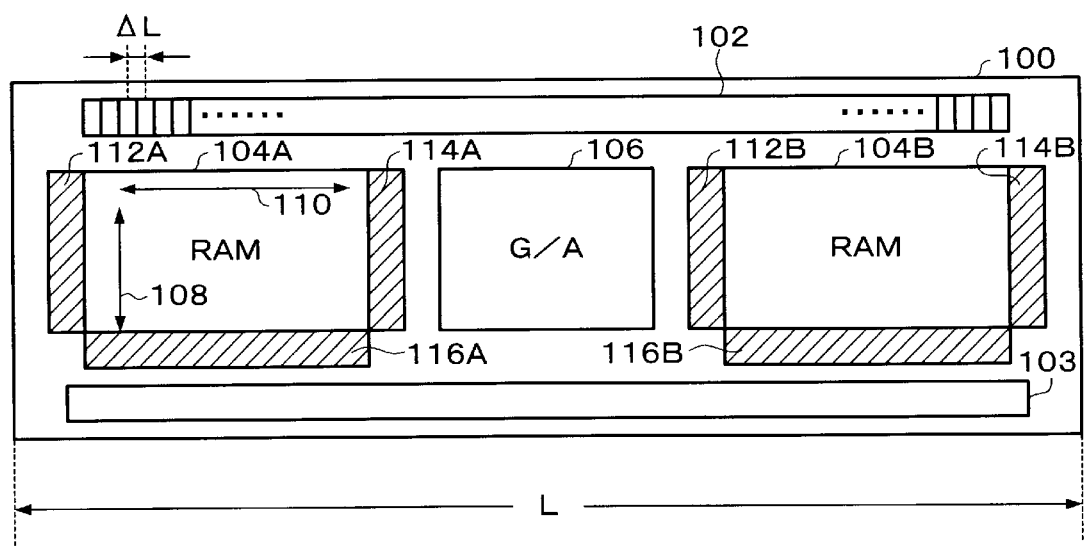
FIG. 1 is a schematic diagram schematically showing a general configuration of the layout of the display driver of the embodiment.

Embodiments of the present invention will now be described.

The embodiments described below do not limit the scope of the invention defined by the claims laid out herein in any sense. The entire configuration described in the embodiment should not be taken as limiting the subject matter defined by the claims herein.

In the case of a display driver, a shrink effect can not be sufficiently achieved by only using fine processing. This is attributable to an interval between output electrodes of the display driver from which display data are supplied to a display panel to be driven and to the method of driving that depends on the type of the display panel.

Specifically, in order to achieve a sufficient shrink effect in the display driver by improving fineness, memory cells that form a RAM incorporated in the same must be provided within a given interval between the output electrodes, and they must be arranged in accordance with the method of driving. For this purpose, the number of memory cells provided in the direction in which the output electrodes of the display driver are aligned must be an integral multiple of the number of them in the case of manufacture utilizing a conventional process. For example, when a 0.18 μm process is used to shrink memory cells provided within an interval as described above in a display driver manufactured using a 0.25 μm process, a sufficient effect can not be achieved unless the number of memory cells provided in the same direction is at least doubled.

In practice, however, cells as many as twice the quantity achievable with the prior art can not be provided in the same direction even if they are shrunk using the 0.18 μm process. In particular, in the case of memory cells having a three-port configuration consisting of two ports for inputting still-image data and moving-image data independently and an output port for reading display data, such an arrangement becomes more difficult to achieve because of limitations associated with an interval between bit lines that are arranged in the column direction. In this case, therefore, it is not possible to achieve a sufficient shrink effect even though costly fine processing is used.

The embodiments were conceived taking the above described technical problem into consideration and, according to the present embodiment, it is possible to provide a display driver incorporating a RAM in which a plurality of memory cells, e.g., even memory cells having a three-port configuration, can be provided within the interval between the output electrodes thereof and to provide a display unit and an electronic apparatus utilizing the same.

One embodiment relates to a display driver incorporating a RAM formed of at least a plurality of memory cells provided for each pixel, each of the memory cells comprising:

a flip-flop having first and second nodes which store logic levels complementary to each other;

a first switching element which electrically connects a first bit line with the first node when a first word line becomes active;

a second switching element which electrically connects a second bit line with the first node when a second word line becomes active;

a setting circuit which sets the second node at a first logic level based on a set signal; and a circuit which outputs the logic level stored at the second node to a display read line based on a given read signal, the display driver comprising a set signal generation circuit which generates the set signal for each pixel, the set signal setting the second node at the first logic level for the memory cells for a pixel.

According to this embodiment, when data are written in a flip-flop having the first and second nodes for storing logic levels complementary to each other, the second node is set at the first logic level by the set signal generated by the set signal generation circuit regardless of the written data. The word line for writing is activated, and data from the relevant bit line are written in the first node. Specifically, when the data on the bit line for writing is at the second logic level, the state set by the set signal is maintained as it is. When the data on the same bit line is at the first logic level, the first node is set at the first logic level, and the second node is set at the second logic level to maintain a complementary state.

With this configuration, there is no need for using a pair of bit lines for each memory cell unlike the prior art, which makes it possible to reduce the number of bit lines significantly. In addition, data can be efficiently written in a memory cell having at least two input ports by generating a set signal for each pixel.

Further, according to this embodiment, the set signal generation circuit can generate the set signal for each pixel, the set signal becoming active on condition that a pulse signal of which level is varied per pixel writing and the first or second word line become active.

According to this embodiment, since the above-described set signal becomes active when the pulse signal and the first or second word line for writing become active, it is possible to perform data writing as described above only at a pixel to be written. This makes it possible to efficiently control writing of independent data with minimum operations using the first and second word lines and bit lines.

Further, this embodiment may include a circuit which precharges the first bit line to a precharge potential prior to a read operation;

a constant potential generation circuit which sets a given node at a constant potential lower than the precharge potential at least when a read operation is performed; and an output buffer circuit which compares a potential on the first bit line with a potential at the given node and outputs a signal at a logic level corresponding to the result of the comparison.

According to this embodiment, there is provided a constant potential generation circuit for generating a constant potential that is lower than a precharge potential at a single bit line on which data read from a memory cell are transmitted. Thus, data are read from a memory cell on to a bit line after precharging the bit line prior to a read operation, and the potential on the bit line is compared with a constant potential as described above at least when a read operation is performed to allow determination of the logic level of the data read on to the bit line. Since data can be read at a high speed even with a single bit line in this manner, processes such as high speed rewriting of display data can be preferably performed.

Further, according to this embodiment, the constant potential generation circuit may comprise first and second capacitors each of which is connected to the given node at one end, another end of the first capacitor may be connected to a ground potential, another end of the second capacitor may be connected to a potential equivalent to the precharge potential prior to a read operation and is connected to the ground potential at least when a read operation is performed.

In this embodiment, the first and second capacitors are connected to the given node which are set at a constant potential as described above; the first capacitor is used in a fixed manner; and the second capacitor has different potentials at one end thereof prior to a read operation and in a read operation. This makes it possible to vary a composite capacity of the capacitors connected to the given node. Therefore, the potential at the given node can be generated at a constant potential lower than a precharge potential by varying the composite capacity using stored charges by setting the precharge potential prior to reading. As a result, it is possible to generate a constant potential lower than a precharge potential required for a high speed read operation with a very simple configuration.

Further, according to this embodiment, the memory cells may be arranged for each pixel in the row direction, the display read line may be provided for each memory cell in the column direction, the memory cells being divided into given blocks, the display read line transmitting display data read from one of the memory cells, the display driver may further comprises:

a plurality of display word lines which sequentially select the memory cells for each pixel along the column direction;

a main read line shared by the memory cells in the column direction which transmits the display data read from the memory cells sequentially selected by the plurality of display word lines; and a plurality of main switches which connect the display read line provided at each of the blocks with the main read line.

In this embodiment, a display read line is connected to each memory cell. The display read lines in each given block can be selectively connected to the main read line that is connected to output electrodes for driving display through the main switches. Since this makes it possible to reduce the capacity of the display read line connected to each memory cell and to transmit data to the output electrodes through the main switches only when needed, the driving capacity of a transistor serving as each memory cell can be reduced, which contributes to reductions in size and power consumption.

In this embodiment, n×A (A is a natural number) pieces of the memory cells may be arranged in the row direction such that $$(n \times LC) \times A < \Delta L$$

is satisfied where n represents the number of bits of gray scale data per dot; ΔL represents a pitch of output electrodes which output display data; and LC represents a pitch of the memory cells.

One dot is an element that forms a part of a pixel and, for example, this means that each of an R signal, a G signal, and a B signal forms one dot when one pixel is formed of the R, G, and B signals. The pitch LC of memory cells may be the lateral width of each memory cell, or may include a width that is required for providing a control circuit for accessing the memory cells.

In this embodiment, a plurality of memory cells are arranged in the row direction for storing pixel data of pixels whose gray scale data comprises at least two bits. Thus, it is possible to reduce the length of the display driver in the row direction significantly and to achieve an effective reduction of a chip size in shrinking the chip.

The present embodiment may include a latch circuit which latches display data read by activating a word line connected to each of n×A pieces of the memory cells arranged in the row direction; and a selector circuit which sequentially and selectively outputs display data for each pixel latched in the latch circuit.

According to this embodiment, memory cells for a plurality of pixels are arranged side by side in the row direction within the interval between the output electrodes. Thus, pixel data for a plurality of pixels can be simultaneously read by activating a single word line. The data can be latched at an output stage and output from each row sequentially, which makes it possible to reduce the number of times the word lines are driven and to at least reduce consumption of a current as a result of charging and discharging of the word lines.

A display unit according to another embodiment includes a panel having electro-optical elements driven by a plurality of first electrodes and a plurality of second electrodes, the above-described display driver which drives the plurality of first electrodes, and a scan driver which scans the plurality of second electrodes.

This embodiment makes it possible to display a mixture of still-images and moving-images while reducing a burden on an external MPU.

An electronic apparatus according to further embodiment includes the above-described display unit and an MPU which supplies a command, still-image data, and moving-image data to the display unit.

According to this embodiment, a mixture of still-images and moving-images can be displayed on the display unit, and still-image data and moving-image data required for the display can be written in memory cells which store display data independently each other. Therefore, there is no need for consideration of the writing timing or reading timing for display, and accordingly the MPU can perform advanced processing.

Embodiments will now be described in detail with reference to the drawings.

1. Display Driver

FIG. 1 schematically shows a general layout of a display driver (display drive circuit) according to the present embodiment.

A display driver 100 of the present embodiment includes an output driver circuit area 102, an input circuit area 103, RAM areas 104A and 104B, and a gate array (hereinafter abbreviated to as "G/A") area 106 provided on a semiconductor chip.

In the output driver circuit area 102, output driver circuits are arranged in the longitudinal direction of the semiconductor chip with an interval ΔL. The output driver circuit converts display data (gray scale data) read from a RAM into a voltage suitable for driving a display element, e.g., a liquid crystal element in the case of a liquid crystal panel.

In the RAM areas 104A and 104B, memory cells having three ports are arranged in a bit line direction 108 and a word line direction 110. Each of the memory cells has a port for still-image data, a port for moving-image data, and a port for a display panel. For example, the port for still-image data, the port for moving-image data, and the port for a display panel are used as an input/output port, an input port, and an output port, respectively.

The embodiment is characterized in that the RAM areas 104A and 104B have memory cells for at least two pixels are provided adjacently to each other in the word line direction 110 for each of driving electrodes provided in the directions of columns of the display panel.

For example, in the RAM areas 104A and 104B, memory cells for two pixels associated with display pixels on the first and second rows of the display panel provided adjacently to each other in the word line direction 110, memory cells for two pixels associated with display pixels on the third and fourth rows, and so on are sequentially arranged in the bit line direction 108, the memory cells being associated with each of the driving electrodes arranged in the column direction of the display panel.

Further, RAM control circuits such as address decoders (page decoders and column decoders) for selecting word lines and bit lines are provided in areas 112A, 114A, 116A, 112B, 114B, and 116B around the RAM areas 104A and 104B.

In the G/A area 106, there is provided a control circuit for inputting and outputting moving-image data, a display control circuit for outputting display data to the display panel to be driven at constant cycles, and so on.

The following description is based on an assumption that memory cells for two pixels are provided adjacently to each other in the word line direction 110 for each of driving electrodes provided in the column direction of the display panel.

Figure 2:
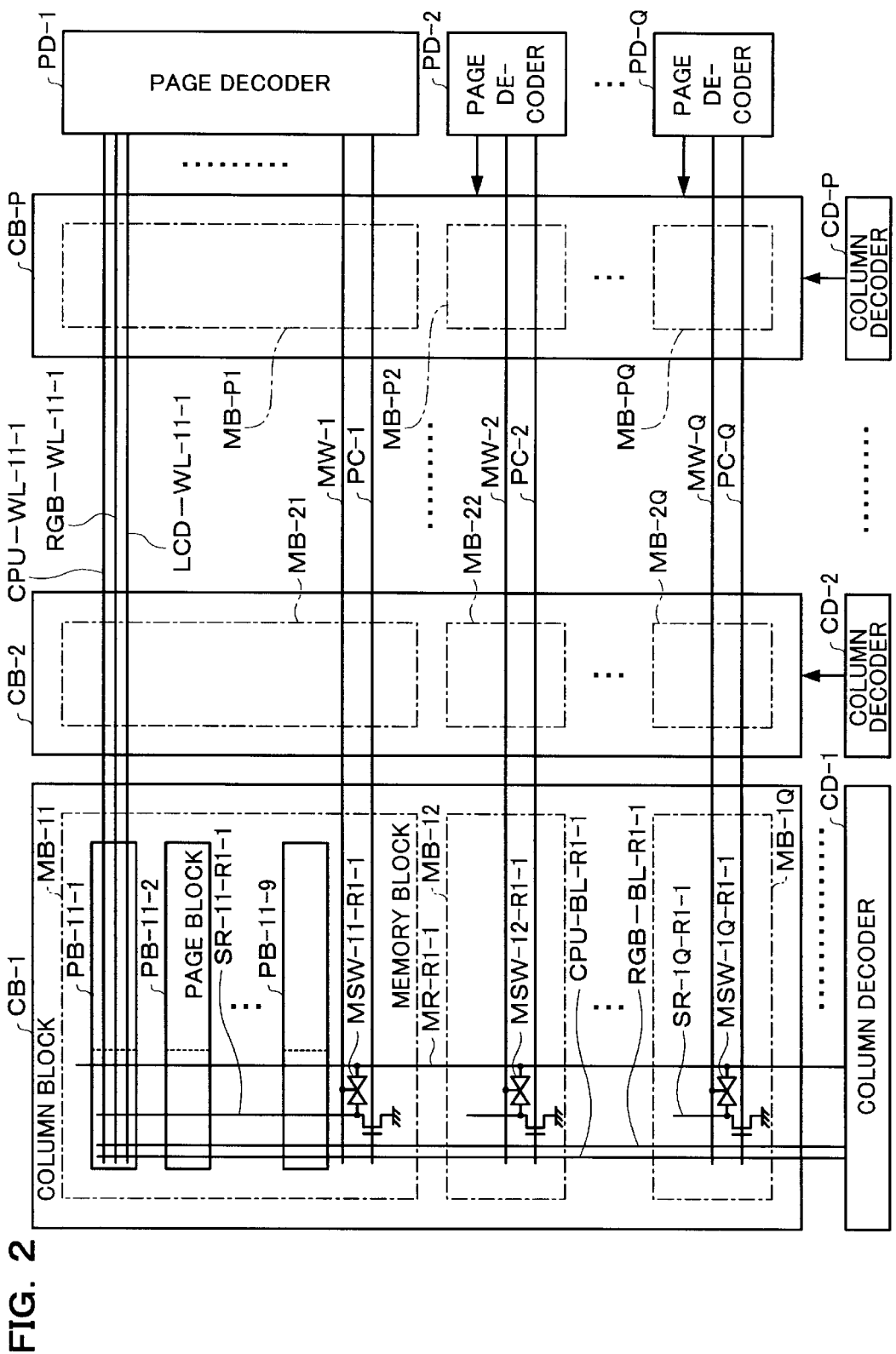
FIG. 2 is a schematic diagram schematically showing a configuration of a RAM area of the display driver of the embodiment.

FIG. 2 schematically shows a configuration of a RAM area of the display driver of the present embodiment.

The following description is based on an assumption that the RAM areas 104A and 104B shown in FIG. 1 are located in one region.

In the display driver of the present embodiment, m×n memory cells, i.e., m memory cells in the row direction (word line direction) and n memory cells in the column direction (bit line direction), are provided in a RAM area. Each of the memory cells has a three-port memory configuration as described above, and data are input and output to and from the same on a pixel-by-pixel basis.

One pixel is formed by three dots which are represented by an R signal, a G signal, and a B signal, respectively. For example, when there are 64 (=$2^6$) gray scales, since there are six bits of gray scale data for each of the R, G, and B signals, one pixel is formed by 18 bits (six bits for one dot).

The memory cells are divided into column blocks CB-1, CB-2, . . . , CB-P each of which are formed by memory cells having a plurality of bits for storing display data for two pixels in the word line direction. The column blocks are identified by column decoders CD-1, CD-2, CD-3, . . . , CD-P.

Memory cells in each column block are divided in the bit line direction into memory blocks MB-1, MB-2, . . . , MB-Q each of which is formed by nine memory cells, for example.

Specifically, for example, memory blocks MB-11 through MB-1Q are arranged in the bit line direction in the column block CB-1.

In each memory block MB, page blocks are arranged in the bit line direction, the page blocks including memory cells for storing display data for two pixels arranged in the word line direction. For example, page blocks PB-11-1 through PB-11-9 are arranged in the bit line direction in a memory block MB-11, the page blocks having memory cells for storing display data for two pixels arranged in the word line direction. For example, the page block PB-11-1 is the first row of the memory block MB-11, and the page blocks are identified by page decoders PD-1 through PD-Q.

In each column block, a central processing unit (hereinafter abbreviated to as "CPU") bit line CPU-BL is provided in the word line direction in association with each of memory cells that form parts of the page blocks. The CPU bit lines CPU-BL transmit still-image data that are written and read by an external CPU (not shown) through the column decoders. A CPU bit line CPU-BL is commonly connected to memory cells arranged in the bit line direction in each column block. While FIG. 2 shows a bit line as described above for only one memory cell, the other memory cells are also connected in the same way.

Similarly, in each column block, an RGB bit line RGB-BL is provided in the word line direction in association with each of memory cells that form parts of the page blocks. The RGB bit lines RGB-BL transmit moving-image (RGB) data which are written and read by an external digital signal processor (which is not shown and hereinafter abbreviated to as "DSP") through the column decoders independently of the CPU. Such an RGB bit line RGB-BL is also commonly connected to memory cells arranged in the bit line direction in each column block. While FIG. 2 shows a bit line as described above for only one memory cell, the other memory cells are also connected in the same way.

In each memory block, a sub read line SR for reading display data for driving the display panel to be driven is provided in the word line direction in association with each of memory cells that form parts of the page blocks. Such a sub read line SR is commonly connected to memory cells arranged in the bit line direction in each memory block. Each sub read lines SR is precharged by an N-type MOS transistor TR at a predetermined potential (e.g., at the level of the ground potential) through a precharge line PC. While FIG. 2 shows a sub read line SR as described above for only one memory cell, the other memory cells are also connected in the same way.

In each column block, a main read line MR commonly connected to the sub read lines of the memory blocks is provided in the word line direction in association with each of memory cells that form parts of the page blocks. Such a main read line MR is connected to sub read lines through main switches MSW. For example, sub read lines SR-11-R1-1 through SR-1Q-R1-1 commonly connecting one memory cell in memory blocks MB-11 through MB-1Q are connected to a main read lined MR-R1-1 through respective main switches MSW-11-R1-1 through MSW-1Q-R1-1. While FIG. 2 shows a main read line as described above for only one memory cell, the other memory cells are also connected in the same way.

The main switches MSW for connecting such sub read lines SR and main read lines MR are turned on and off by main word lines MW for display. The main word lines MW for display are arranged in the word line direction in association with respective memory blocks and activated by the page decoders PD-1 through PD-Q.

In the word line direction, a CPU word line CPU-WL for writing or reading of still-image data by the CPU (not shown) is connected to all of memory cells that form each page block.

Similarly, RGB word lines RGB-WL for writing or reading of moving-image data by the DSP (not shown) are connected to all of memory cells that form each page block.

Figure 3:
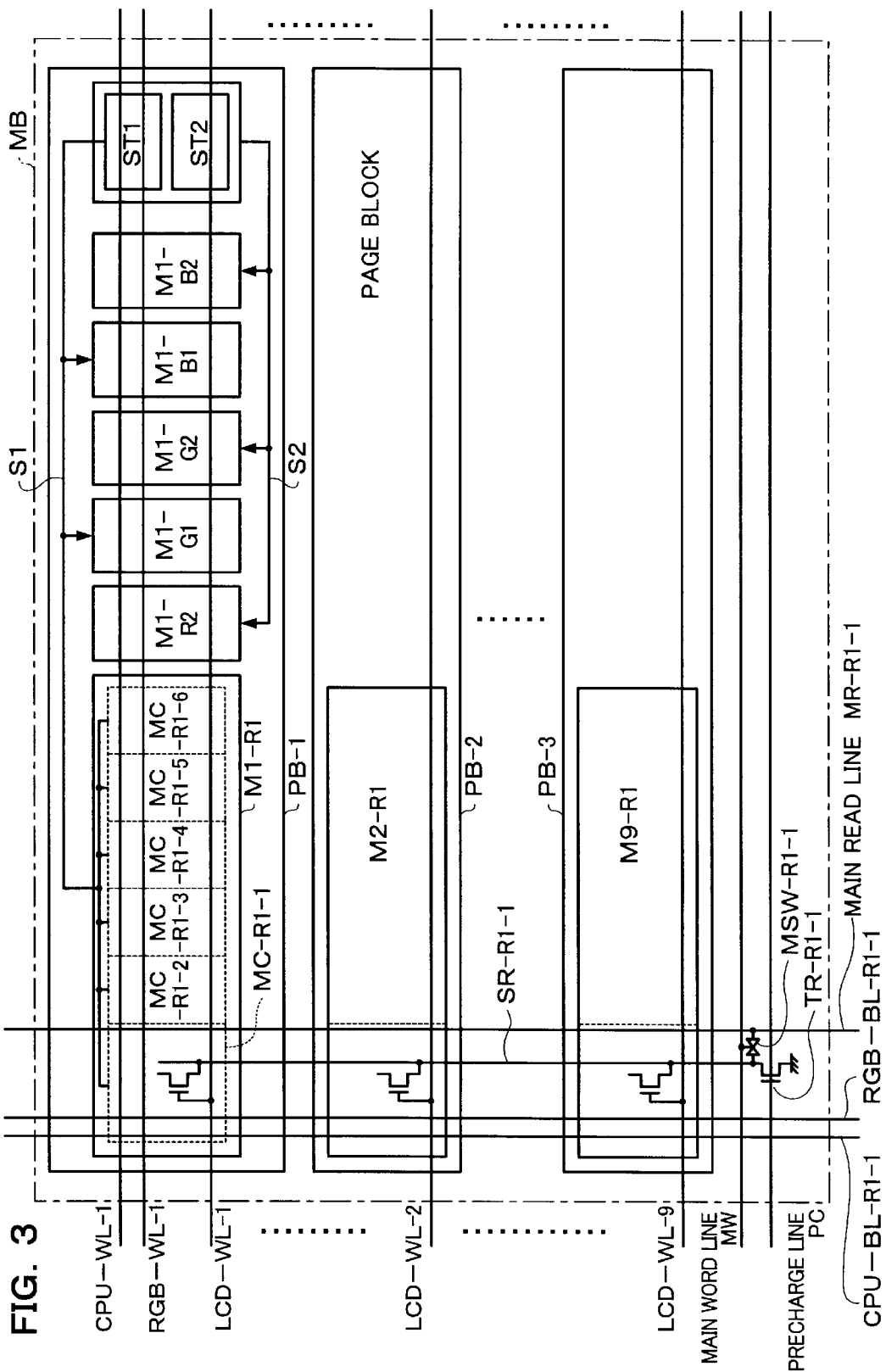
FIG. 3 is a schematic diagram showing a general configuration of a main block of the display driver of the embodiment.

FIG. 3 shows a schematic configuration of the main block shown in FIG. 2.

The description will appropriately omit parts identical to the parts described with reference to FIG. 2.

As described above, a plurality of memory cells for storing display data for two pixels are arranged in the word line direction in each page block. The following description is based on an assumption that one pixel is formed by an R signal having six bits, a G signal having six bits, and a B signal having six bits. In this case, memory cells for 18 bits (MC-R-1 through MC-R-6, MC-G-1 through MC-G-6, and MC-B-1 through MC-R-6) are arranged in the word line direction in each page block.

Let us assume that memory cell macros for storing the R, G, and B signals with six bits for one of the two pixels stored in the page block PB-1 in the main block are represented by M1-R1, M1-G1, and M1-B1 respectively and that memory cell macros for storing the R, G, and B signals with six bits for the other pixel are represented by M1-R2, M1-G2, and M1-B2 respectively. Then, for example, the memory cell macros M1-R1, M1-R2, M1-G1, M1-G2, M1-B1, and M1-B2 are arranged in the order listed in the word line direction starting with the memory cell macro M1-R1 located at the leftmost position. Similarly, in the page block PB-2, the memory cell macros M2-R1, M2-R2, M2-G1, M2-G2, M2-B1, and M2-B2 are arranged in the order listed in the word line direction starting with the memory cell macro M2-R1 located at the leftmost position. As a result, for example, memory cells for storing pixel data of the first and second rows, third and fourth rows, fifth and sixth rows, and so on of the display panel to be driven can be arranged in the column direction in the column block CB-1 starting with the memory cells for the first and second rows located in the uppermost position of the column block.

A page block PB in the present embodiment includes set circuits ST1 and ST2 for setting each pixel at a given logic level.

For example, in response to a set signal S1, a set circuit ST1-1 in the page block PB-1 sets the 18 memory cells forming the memory cell macros M1-R1, M1-G1, and M1-B1 associated with display data for one of the two pixels stored in the page block PB-1 at a given value at the same timing.

For example, in response to a set signal S2, a set circuit ST2-1 in the page block PB-1 sets the 18 memory cells forming the memory cell macros M1-R2, M1-G2, and M1-B2 associated with display data for the other pixel stored in the page block PB-1 at a given value at the same timing.

2. Configuration of Memory Cell

Figure 4:
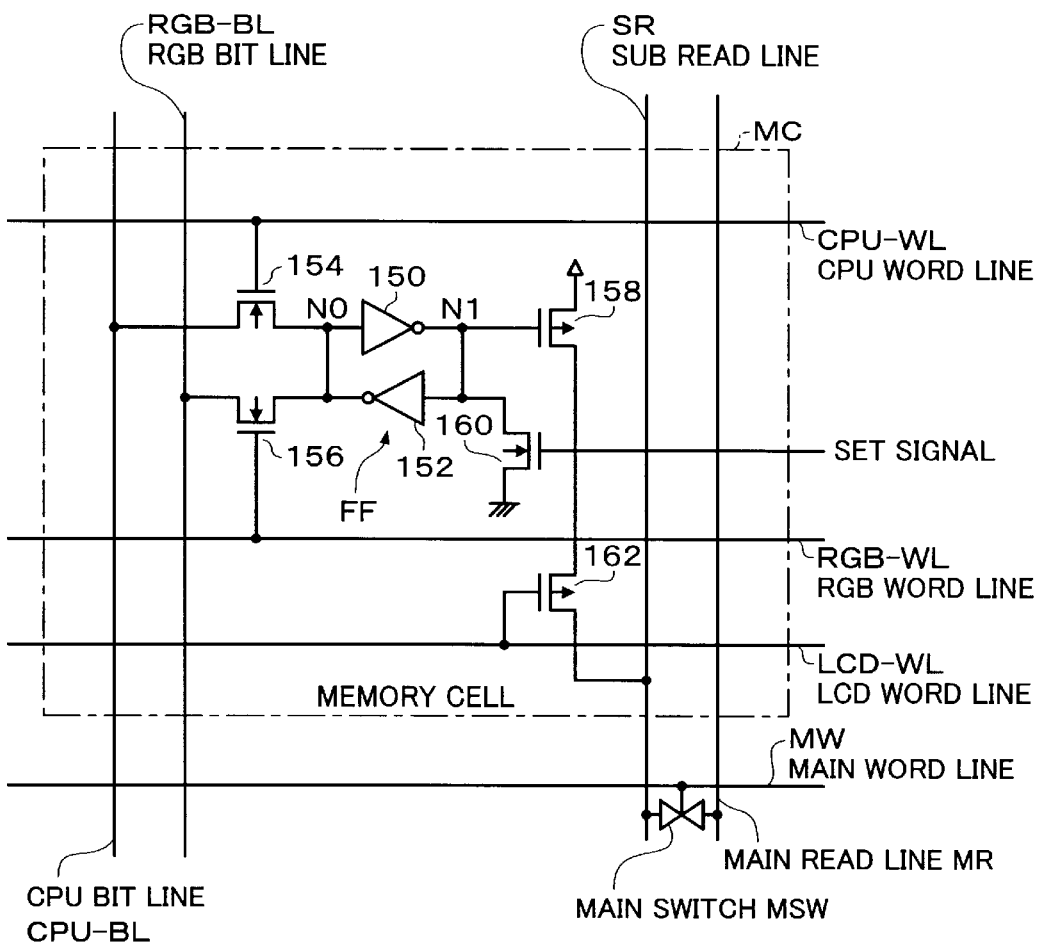
FIG. 4 is a circuit configuration diagram showing a general configuration of a memory cell forming a part of a page block according to the embodiment.

FIG. 4 shows a schematic configuration of a memory cell which forms a part of a page block as shown in FIG. 3.

In a memory cell MC in the present embodiment, there is provided at least a CPU bit line CPU-BL for transmitting still-image data input and output by the above-described CPU, an RGB bit line RGB-BL for transmitting moving-image data input and output by the DSP, and a sub read line SR for transmitting read display data to, for example, a liquid crystal panel that is a display panel to be driven. The sub read line SR for each memory block is connected to a main read line MR through a main switch MSW.

In the memory cell MC, there is provided a CPU word line CPU-WL which is activated when still-image data are input and output by the CPU, an RGB word line RGB-WL which is activated when moving-image data are input and output by the DSP, and an LCD word line LCD-WL which is activated when stored display data are read to, for example, a liquid crystal panel that is a display panel to be driven.

The CPU bit line CPU-BL is shared by memory cells arranged in the column direction as shown in FIG. 2 and is connected to a column decoder associated with each column block.

The RGB bit line RGB-BL is shared by the memory cells arranged in the column direction as shown in FIG. 2 and is connected to the column decoder associated with each column block.

The sub read line SR for each memory block is shared by the memory cells arranged in the column direction as shown in FIG. 2.

The CPU word line CPU-WL is shared by memory cells arranged in the row direction as shown in FIG. 2 and is connected to a page decoder.

The RGB word line RGB-WL is shared by the memory cells arranged in the row direction as shown in FIG. 2 and is connected to the page decoder.

The LCD word line LCD-WL is shared by the memory cells arranged in the row direction as shown in FIG. 2 and is connected to the page decoder.

Such a memory cell MC includes a flip-flop FF formed by connecting input terminals and output terminals of first and second inverters 150 and 152 to each other. The flip-flop FF maintains logic levels (or states in a broader sense) which are complementary to each other at nodes N0 and N1.

The drain terminals (source terminals) of N-type MOS transistors 154 and 156 as switching elements are connected to the node N0. The gate terminal of the N-type MOS transistor 154 is connected to the CPU word line CPU-WL, and the source terminal (drain terminal) of the same is connected to the CPU bit line CPU-BL. The gate terminal of the N-type MOS transistor 156 is connected to the RGB word line RGB-WL, and the source terminal (drain terminal) of the same is connected to the RGB bit line RGB-BL.

The gate terminal of a P-type transistor 158 as a switching element and the drain terminal of an N-type MOS transistor 160 as a switching element are connected to the node N1. The source terminal of the P-type MOS transistor 158 is connected to the power supply potential level, and the drain terminal of the same is connected to the drain terminal (source terminal) of a P-type MOS transistor 162 as a switching element. The source terminal of the N-type MOS transistor 160 is connected to the ground potential level, and a set signal supplied by a set circuit as shown in FIG. 3 is supplied to the gate terminal of the same. The gate terminal of the P-type MOS transistor 162 is connected to the LCD word line LCD-WL, and the source terminal (drain terminal) of the same is connected to the sub read line SR.

Thus, the memory cell MC is characterized in that it has three ports and that it has four bit lines including the sub read line SR for LCD display and the main read line MR.

When a non-volatile memory cell is constituted by a flip-flop as described above, in general, a pair of bit lines B and /B are normally used for writing the node N0 through the N-type MOS transistors. The reason is that a problem associated with an operational margin occurs during writing of data at a logic level "H" when signal levels are transmitted through the N-type MOS transistors.

In the present embodiment, the above-described problem is solved to allow the number of bit lines to be reduced by using only the bit line B and by adding a circuit for setting the node N1 at a logic level "L" with a set signal.

Since this makes it possible to increase the number of memory cells for storing display data for each pixel arranged in the word line direction when shrinking is carried out for each output electrode using fine processing, the effect of chip shrinking can be achieved without changing the driving method specific to the display driver.

2.1 Writing System

In the above-described memory cell MC, since only the bit line B is used, the logic level "H" can not be written at the node N0 through the N-type MOS transistors 154 and 156. In the present embodiment, when the memory cell MC is written, the N-type MOS transistor 160 connected to the node N1 is put in a conductive state with a set signal to temporarily set the node N1 at the ground potential level. As a result, the node N0 is set at the logic level "H" through the second inverter 152.

At this time, if data written through either CPU bit line CPU-BL or RGB bit line RGB-BL is at the logic level "H", there is no change in the level maintained at the node N0 even if the N-type MOS transistors 154 and 156 are turned on. On the contrary, if the data written through either CPU bit line CPU-BL or RGB bit line RGB-BL is at the logic level "L", when the N-type MOS transistors 154 and 156 are turned on as in the prior art, the logic level "L" is set at the node N0 because of the relationship between the N-type MOS transistors in the on-state and the P-type MOS transistors that form the second inverter 152.

Such a set signal is generated by a set circuit ST as shown in FIG. 3 for each pixel. In FIG. 3, for example, the memory cell macros M1-R1, M1-G1, and M1-B1 for storing R, G, and B signals having six bits each for a pixel are set in the same state at the same timing by the set signal S1.

Figure 5:
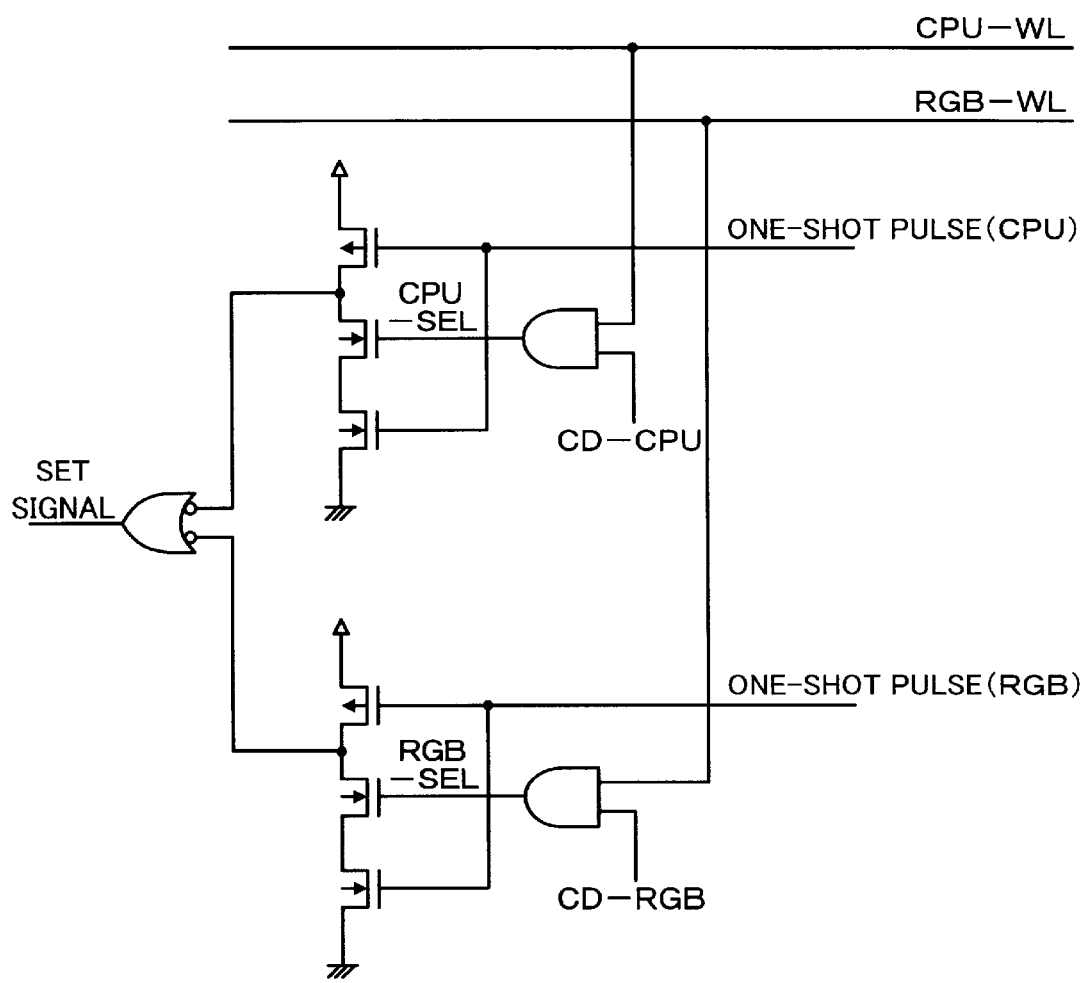
FIG. 5 is a block configuration diagram showing a general configuration of a set circuit according to the embodiment.

FIG. 5 schematically shows a configuration of the set circuit ST.

In the present embodiment, such a set circuit as shown in FIG. 5 is provided for each pixel.

The set circuit ST provided for each pixel activates the set signal when a one-shot pulse (CPU) and a CPU-SEL signal generated by a write signal WR-CPU from the CPU simultaneously become active. The CPU-SEL signal becomes active when the CPU word line CPU-WL and a CD-CPU signal indicating that the column of the interest has been selected as a column to be written by the CPU are simultaneously activated. Referring to the one-shot pulse signal (CPU), a one-shot pulse generated by the write signal WR-CPU may be supplied only to the memory block associated with the column decoder.

The set circuit ST activates the set signal when a one-shot pulse (RGB) and an RGB-SEL signal generated by a write signal WR-RGB from the DSP simultaneously become active. The RGB-SEL signal becomes active when the RGB word line RGB-WL and a CD-RGB signal indicating that the column of the interest has been selected as a column to be written by the CPU are simultaneously activated. Referring to the one-shot pulse signal (RGB), a one-shot pulse generated by the write signal WR-RGB may be supplied only to the memory block associated with the column decoder.

Figure 6:
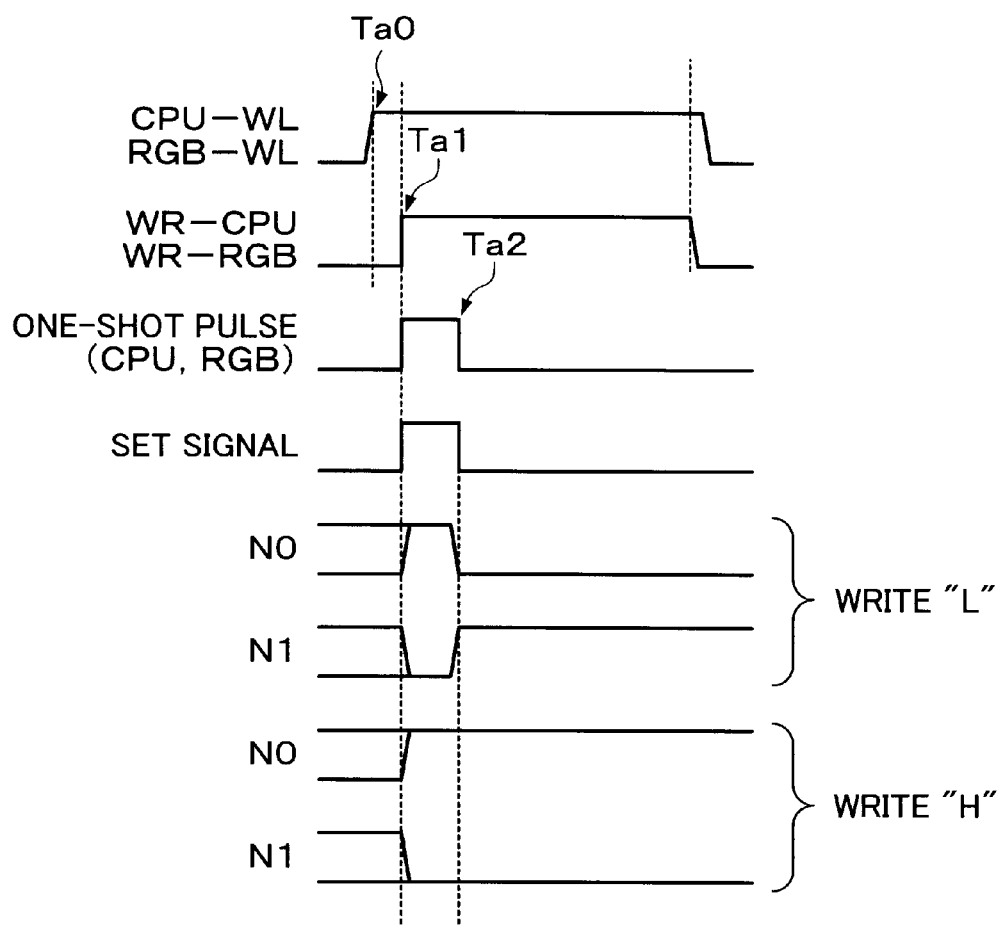
FIG. 6 is a timing chart showing an example of an operation of writing in a memory cell MC with a set signal according to the embodiment.

FIG. 6 shows an example of an operation of writing in the memory cell MC with a set signal generated by the set circuit shown in FIG. 5.

First, when still-image data or dynamic data are written by the CPU (DSP), the CPU word line CPU-WL (RGB word line RGB-WL) is activated by the page decoder PD and column decoder CD associated with a pixel to be written (Ta0).

Subsequently, the write signal WR-CPU (WR-RGB) becomes active to generate a one-shot pulse (Ta1). The set signal also becomes active to set the node N1 of the memory cell MC at the logic level "L" and to set the node N0 at the logic level "H".

For example, when the CPU writes the logic level "L" in the memory cell MC, the CPU bit line CPU-BL is at the "L" potential, and the node N0 tends to transfer to the logic level "L" when the CPU word line CPU-WL is activated. However, it stays at the logic level "H" until step Ta1 occurs and transfers to the logic level "L" at the same time when the set signal becomes inactive (Ta2). The Node N1 then transfers to the logic level "H".

For example, when the CPU writes the logic level "H" in the memory cell MC, the CPU bit line CPU-BL is at the "H" potential, and the node N0 stays at the logic level "H" and the node N1 also stays at the logic level "L" when the CPU word line CPU-WL is activated.

Since a memory cell associated with a pixel at which writing is to take place is thus selected using a word line and a one-shot pulse and logic level "H" is temporarily set at the node N0, it is possible to write the logic levels "L" and "H" at the flip-flop through a single N-type MOS transistor which is activated by the word line. This makes it possible to reduce the number of bit lines.

2.2 Read System for Display

Display data stored in a memory cell in a RAM area having a configuration as described above are supplied to a display panel through the sub read line SR and main read line MR in a period of 1/60 sec. for example.

In the present embodiment, the sub read line SR is first precharged to the ground potential level prior to a read operation, and the LCD word line LCD-WL connected to the memory cell of the pixel of interest is activated to put the P-type MOS transistor 162 in a conductive state.

Since the P-type MOS transistor 158 is therefore on when the logic level "L" is maintained at the node N1 of the memory cell MC, the sub read line SR is connected to the power supply potential level to change the potential on the sub read line SR to the "H" potential. It is therefore possible to read the logic level "H" maintained at the node N0 of the memory cell MC by detecting the same potential through the main read line MR.

On the contrary, when the logic level "H" is maintained at the node N1 of the memory cell MC, since the P-type MOS transistor 158 remains off, the potential on the sub read line SR does not change. It is therefore possible to read the logic level "L" maintained at the node N0 of the memory cell MC by detecting the same potential through the main read line MR.

A description will now be made on a read operation for display performed in a RAM area constituted by such memory cells having the configuration shown in FIGS. 2 and 3.

Figure 7:
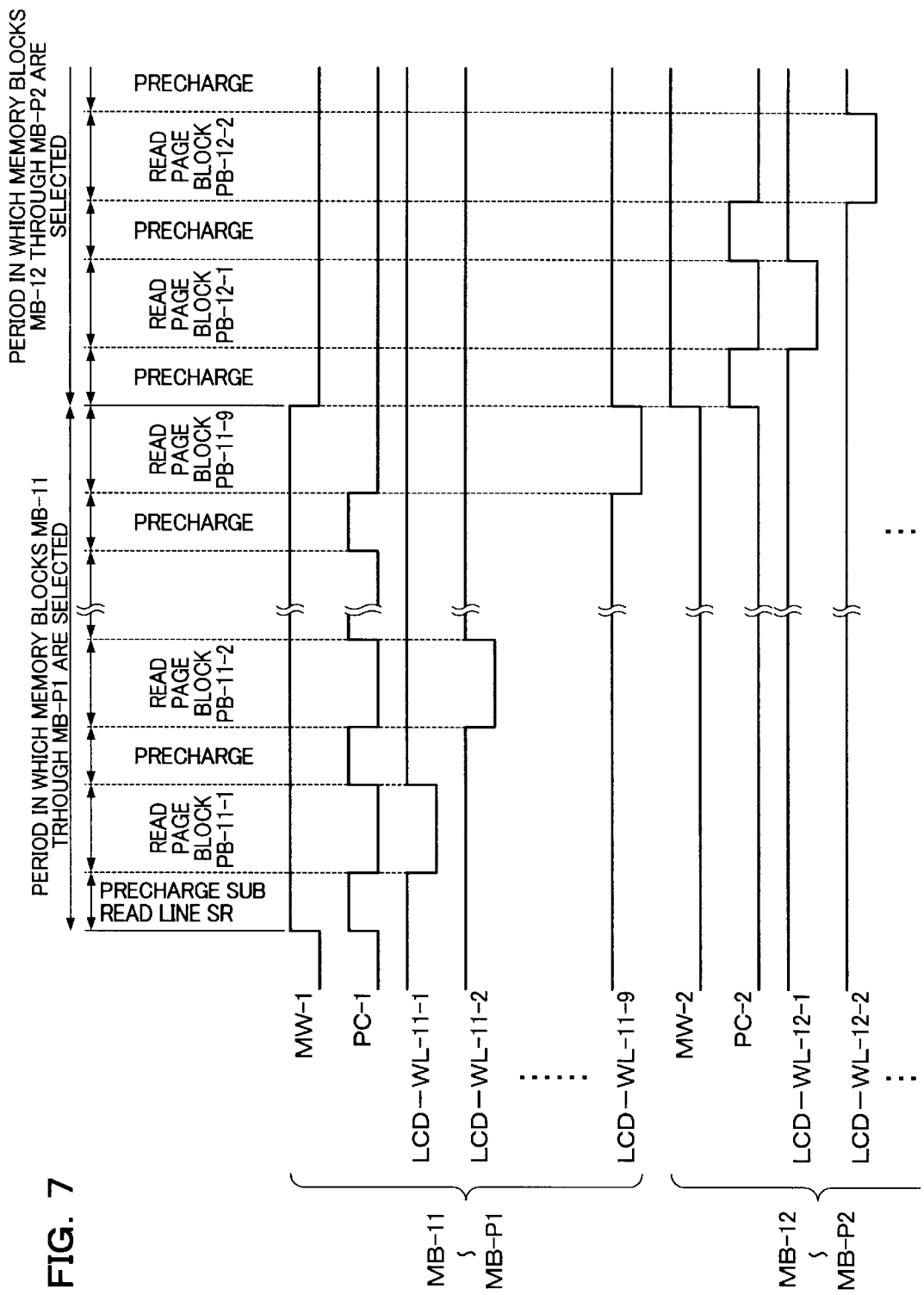
FIG. 7 is a timing chart schematically showing a read operation for display from the RAM area formed by memory cells according to the embodiment.

FIG. 7 schematically shows a read operation for display performed in a RAM area constituted by such memory cells.

As shown in FIG. 7, the read operation for display is carried out by sequentially selecting memory blocks as shown in FIG. 2 arranged in the word line direction and sequentially selecting memory cells in page blocks arranged in the word line direction in each memory block, the memory cells being selected in the bit line direction.

First, the page decoder PD-1 sets the main word line MW-1 at the "H" potential to activate the same, and the precharge line PC-1 puts the N-type MOS transistors TR in a conductive state to precharge the sub read lines of the main blocks MB-11 through MB-P1 of the column blocks CB-1 through CB-P to the "L" potential.

Thereafter, the page decoder PD-1 sets the LCD word line LCD-WL-11-1 connected to the memory cells in the page blocks PB-11-1 through PB-P1-1 of the column blocks CB-1 through CB-P at the "L" potential to activate the same, thereby reading data stored in the memory cells.

The data stored in the memory cells in the page blocks PB-11-1 through PB-P1-1 of the column blocks CB-1 through CB-P thus read on to the sub read lines SR are output to the main read lines MR because the respective main switches MSW are on.

Next, in order to read data stored in the memory cells in the page blocks PB-11-2 through PB-P1-2 of the column blocks CB-1 through CB-P, the page decoder PD-1 precharges the sub read lines of the main blocks MB-11 through MB-P1 of the column blocks CB-1 through CB-P to the "L" potential through the precharge lines PC-1 with the main word line MW-1 at the "H" potential.

Then, the page decoder PD-1 sets the LCD word line LCD-WL-11-2 connected to the memory cells in the page blocks PB-11-2 through PB-P1-2 of the column blocks CB-1 through CB-P at the "L" potential to activate them this time, thereby reading data stored in the memory cells.

Data are similarly read from the page blocks PB-11-9 through PB-P1-9 of the memory blocks MB-11 through MB-P1 of the column blocks CB-1 through CB-P, and this terminates the period during which the memory blocks MB-11 through MB-P1 are selected.

Next, the page decoder PD-2 sets the main word line MW-2 at the "H" potential to activate the same, and the precharge line PC-2 puts the N-type MOS transistors TR in a conductive state to precharge the sub read lines of the main blocks MB-12 through MP-P2 of the column blocks CB-1 through CB-P to the "L" potential.

Then, the page decoder PD-2 sets the LCD word line LCD-WL-12-1 connected to the memory cells in the page blocks PB-12-1 through PB-P2-1 of the column blocks CB-1 through CB-P at the "L" potential to activate them, thereby reading data stored in the memory cells.

The data stored in the memory cells in the page blocks PB-12-1 through PB-P2-1 of the column blocks CB-1 through CB-P read on to the sub read lines SR are output to the main read lines MR because the respective main switches MSW are on.

In this case, the period during which the memory blocks MB-12 through MB-P2 are selected is terminated by reading data from the page blocks PB-11-9 through PB-P1-9 of the memory blocks MB-12 through MB-P2 of the column blocks CB-1 through CB-P.

The same operation is carried out on the memory blocks MB-13 through MB-P3 and MB-14 through MB-P4 of the column blocks CB-1 through CB-P.

2.3 Reading System for CPU

As shown in FIG. 4, since only a bit line B is used to write data in the flip-flop FF of a memory cell MC, the data in the flip-flop FF is read at a speed lower than that in the case of reading with bit lines B and /B, which results in a problem when data stored in the display driver are read by the CPU (or DSP). The reason is that the CPU must perform processes such as rewriting display data stored in memory cells for reversing the same, for example.

Therefore, the memory cells of the present embodiment include a circuit as described below in order to increase the speed of data reading through the CPU bit lines CPU-BL.

Figure 8:
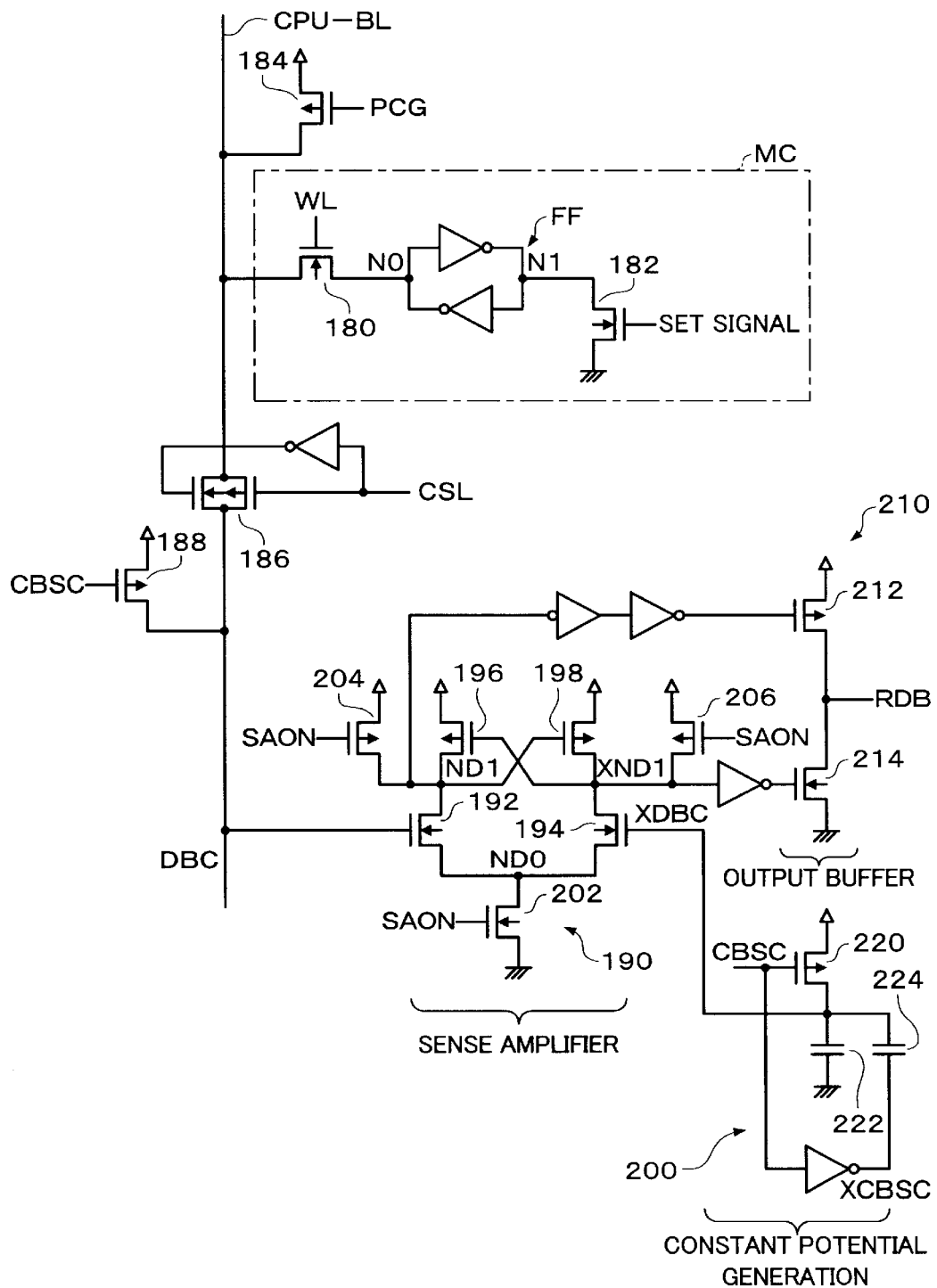
FIG. 8 is a circuit configuration diagram showing an example of a configuration of a read system circuit in the RAM area of the embodiment.

FIG. 8 shows an example of a configuration of a read system circuit in a RAM area in the present embodiment.

A description will be made here on a read system circuit for reading data through the CPU bit lines CPU-BL. Such a circuit is provided for each of the CPU bit lines CPU-BL. Similar circuits may be provided for the RGB bit lines RGB-BL.

A memory cell MC is connected to a CPU bit line CPU-BL as shown in FIG. 4. The configuration of the memory cell MC is schematically shown here, and it is assumed that a flip-flop FF and the CPU bit line CPU-BL are connected through an N-type MOS transistor 180 whose gate terminal is connected to a word line WL. The other node of the flip-flop FF is connected to the ground potential level through an N-type MOS transistor 182 which is turned on and off by a set signal.

The CPU bit line CPU-BL is connected to the power supply potential level through a P-type MOS transistor 184. Thus, when a precharge signal PCG transfers to the logic level "L", the CPU bit line CPU-BL is connected to the power supply potential level to be precharged to the same level.

The CPU bit line CPU-BL is connected to a data line DBC through a transmission gate 186. The transmission gate 186 electrically connects the CPU bit line CPU-BL and the data line DBC when a column select signal CSL transfers to the logic level "L".

The data line DBC is connected to the power supply potential level through a P-type MOS transistor 188. Thus, when a read signal CBSC transfers to the logic level "L", the data line DBC is connected to the power supply potential level to be precharged to the same level.

The data line DBC is connected to a sense amplifier 190.

The sense amplifier 190 includes N-type MOS transistors 192 and 194 whose drain terminals (source terminals) are connected to each other at a node ND0. The sense amplifier 190 also includes P-type MOS transistors 196 and 198 whose source terminals are connected to the power supply potential level.

The gate terminal of the N-type MOS transistor 192 is connected to the data line DBC, and the source terminal (drain terminal) of the same is connected to a node ND1. The gate terminal of the N-type MOS transistor 194 is connected to a node XDBC which is set at a constant potential level at predetermined timing by a constant potential generation circuit 200, and the source terminal (drain terminal) of the same is connected to a node XND1.

The gate terminal of the P-type MOS transistor 196 is connected to the node XND1. The drain terminal of the P-type MOS transistor 196 is connected to the node ND1.

The gate terminal of the P-type MOS transistor 198 is connected to the node ND1. The drain terminal of the P-type MOS transistor 198 is connected to the node XND1.

Such a sense amplifier 190 is activated by a sense amplifier control signal SAON. Therefore, the node ND0 is connected to the drain terminal of an N-type MOS transistor 202 to which the sense amplifier control signal SAON is supplied at the gate terminal thereof and which is grounded at the source terminal thereof. The node ND1 is connected to the drain terminal of a P-type MOS transistor 204 which is connected to the power supply potential level at the source terminal thereof and to which the sense amplifier control signal SAON is supplied at the gate terminal thereof and which is grounded at the source terminal thereof. Similarly, the node XND1 is connected to the drain terminal of a P-type MOS transistor 206 which is connected to the power supply potential level at the source terminal thereof and to which the sense amplifier control signal SAON is supplied at the gate terminal thereof.

Therefore, the sense amplifier 190 is activated when the sense amplifier control signal SAON transfers to the logic level "H".

The node ND1 is connected to the gate terminal of a P-type MOS transistor 212 which forms a part of an output buffer circuit 210 through two inverter circuits.

The node XND1 is connected to the gate terminal of an N-type MOS transistor 214 which forms a part of the output buffer circuit 210 through one inverter circuit.

The source terminal of the P-type MOS transistor 212 is connected to the power supply potential level, and the drain terminal of the same is connected to a read data line RDB.

The constant potential generation circuit 200 includes a P-type MOS transistor 220 and first and second capacitors 222 and 224.

The P-type MOS transistor 220 is supplied with the read signal CBSC at the gate terminal thereof, connected to the power supply potential level at the source terminal thereof, and connected to a node XDBC at the drain terminal thereof.

The first capacitor 222 is grounded at one end thereof and connected to the node XDBC at the other end thereof.

The second capacitor 224 is supplied with an inverted logic of the read signal CBSC at one end thereof and is connected to the node XDBC at the other end thereof.

For example, the first capacitor 222 may be constituted by an N-type MOS transistor whose gate terminal is connected to the node XDBC and whose source and drain terminals are connected to the ground potential level. For example, the second capacitor 224 may be constituted by an N-type MOS transistor whose gate terminal is connected to the node XDBC and which is supplied with the inverted logic of the read signal at the source and drain terminals thereof.

A description will now be made with reference to FIGS. 9 and 10 on operations of such a read system circuit that take place when reading the "H" potential from a memory cell MC and when reading the "L" potential from the same.

Figure 9:
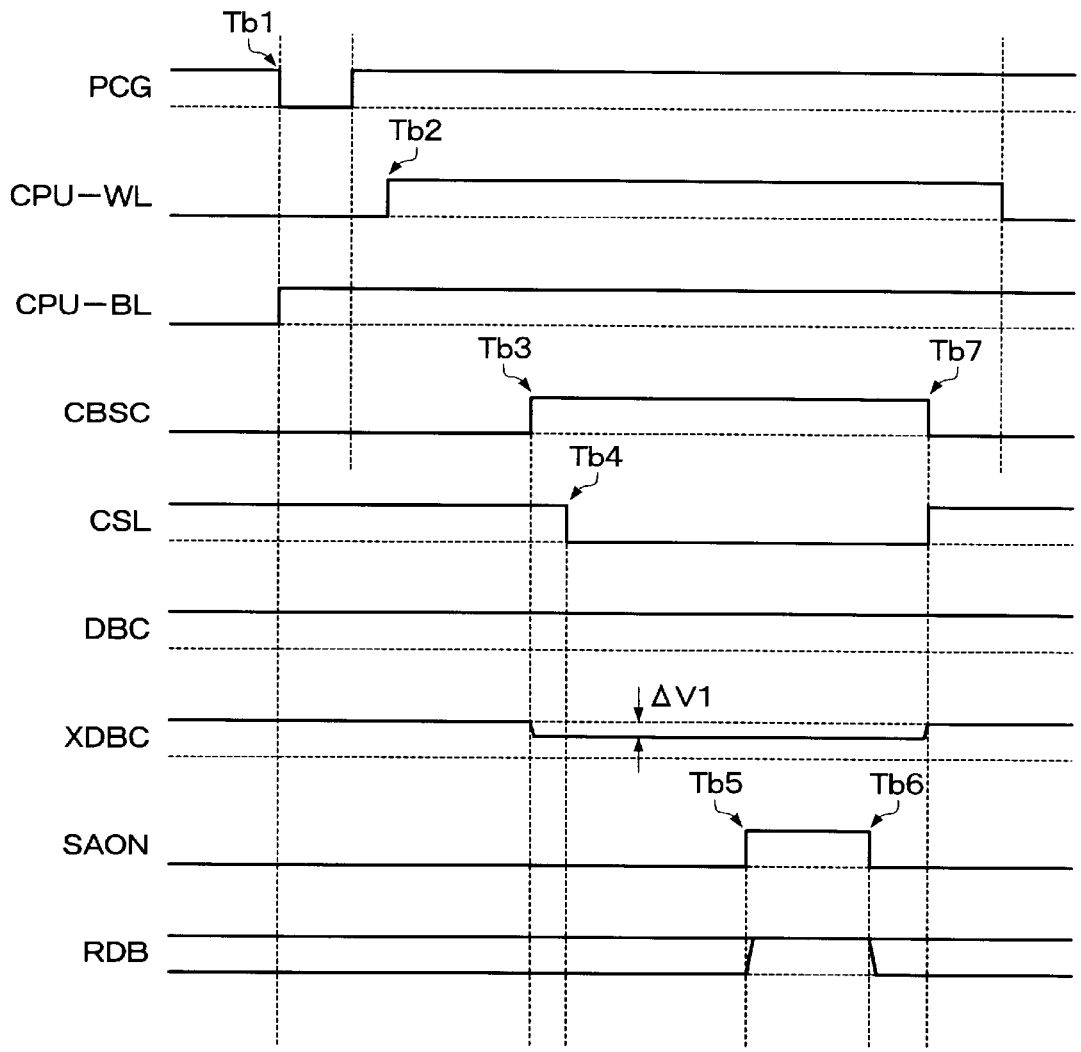
FIG. 9 is a timing chart showing an example of an operation of reading data at a logic level "H" stored in a memory cell MC according to the embodiment.

FIG. 9 shows an example of an operation of reading data at the logic level "H" maintained at a memory cell MC performed by the read system circuit shown in FIG. 8.

For example, when display data of a pixel of interest from the memory cell MC in response to an instruction from the CPU, the precharge signal PCG is set at the logic level "L" (Tb1). As a result, the P-type MOS transistor 184 turns on, and the CPU bit line CPU-BL transfers to the "H" potential.

Next, the word line WL (CPU-WL) of the memory cell MC associated with the pixel to be read is activated (Tb2) to electrically connect the node N0 of the flip-flop FF that maintains the logic level "H" and the CPU bit line CPU-BL through the N-type MOS transistor 180.

At this time, since the CPU bit line CPU-BL is set at the "H" potential as a result of the precharge operation, the potential on the CPU bit line CPU-BL does not change when it is connected to the node N0 of the flip-flop FF.

Until this point in time, the read signal CBSC is kept inactive (logic level "H"), and the data line DBC is precharged to the "H" potential by the P-type MOS transistor 188.

In the constant potential generation circuit 200, since the read signal CBSC is at the logic level "L", the node XDBC is set at the "H" potential through the P-type MOS transistor 220. Therefore, the node XCBSC is at the logic level "H", and the node XDBC is connected to the first and second capacitors 222 and 224.

The following description is based on an assumption that the capacity of the first capacitor 222 is m×C0 and that the capacity of the second capacitor 224 is C0. In this state, the power supply voltage is applied across the first capacitor 222. Since the power supply voltage associated with the logic level "H" is applied across the second capacitor 224, a voltage of 0 V is applied across the second capacitor 224.

Next, when the read signal CBSC is set at the logic level "H" (Tb3), the P-type MOS transistor 220 of the constant potential generation circuit 200 is turned off, and the first capacitor 222 and the second capacitor 224 are inserted in parallel between the node XDBC and the ground potential level. Since the first capacitor 222 therefore accumulates charges in a quantity that is m times the charges in the second capacitor 224, 1/m of the charges moves from the first capacitor 222 to the second capacitor 224. As a result, a voltage V0 at the node XDBC relative to the ground potential level decreases by 1/m ($\Delta V = V0/m$).

Next, the column select signal CSL is activated (logic level "L") (Tb4), and the CPU bit line CPU-BL and the data line DBC are connected through the transmission gate 186. The data line DBC remains at the "H" potential because the CPU bit line CPU-BL is kept at the precharge potential as described above.

When the sense amplifier control signal SAON is then activated (logic level "H") (Tb5), and the output buffer circuit 210 is controlled in accordance with the difference between the potentials at the data line DBC and the node XDBC.

Specifically, since the data line DBC is at the voltage V0 associated with the logic level "H" and the node XDBC is at potential lower than the potential at the data line DBC by V0/m, the nodes ND1 and XND1 transfer to the logic levels "L" and "H", respectively. This turns on the p-type MOS transistor 212 to which the logic level at the node ND1 is input as it is, turns off the P-type MOS transistor 214 of the output buffer circuit 210 to which the signal that is an inversion of the logic level at the node XND1 is input, and sets the read data line RDB at the logic level "H". This is the same logic level as the logic level maintained in the memory cell MC.

Finally, the sense amplifier control signal SAON is set inactive (logic level "L") (Tb6), and the read control signal CBSC and the column select signal are set inactive (Tb7) to complete the series of reading operation.

Figure 10:
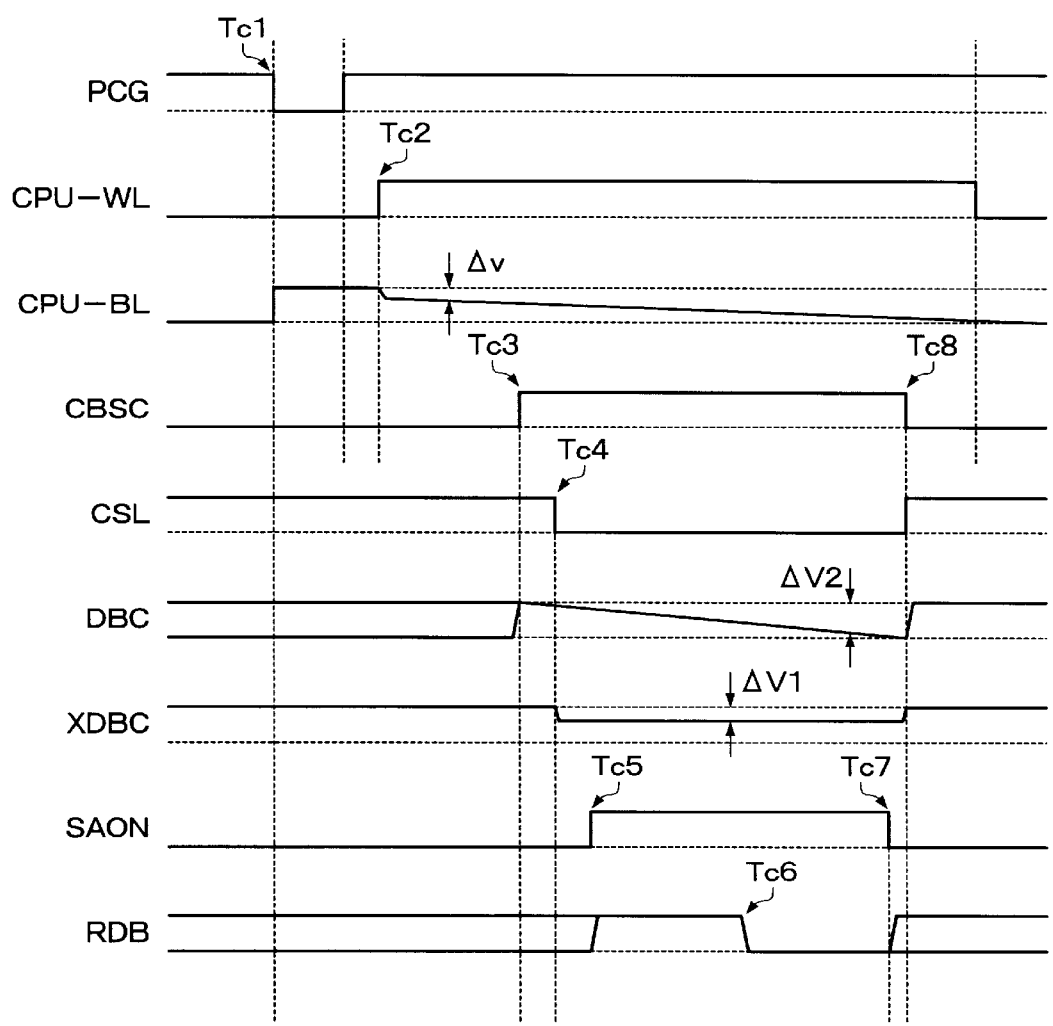
FIG. 10 is a timing chart showing an example of an operation of reading data at a logic level "L" stored in a memory cell MC according to the embodiment.

FIG. 10 shows an example of an operation of reading data at the logic level "L" maintained at a memory cell MC performed by the read system circuit shown in FIG. 8.

For example, when display data of a pixel of interest from the memory cell MC in response to an instruction from the CPU, the precharge signal PCG is set at the logic level "L" (Tc1). As a result, the P-type MOS transistor 184 turns on, and the CPU bit line CPU-BL transfers to the "H" potential.

Next, the word line WL (CPU-WL) of the memory cell MC associated with the pixel to be read is activated (Tc2) to electrically connect the node N0 of the flip-flop FF that maintains the logic level "L" and the CPU bit line CPU-BL through the N-type MOS transistor 180.

At this time, since the CPU bit line CPU-BL is set at the "H" potential as a result of the precharge operation, the "H" potential of the bit line is gradually reduced by the N-type MOS transistor of a memory cell having a small driving capacity by connecting the same to the node N0 of the flip-flop FF.

In the constant potential generation circuit 200, since the read signal CBSC is at the logic level "L" as described above, charges are accumulated only in the first capacitor 222 connected to the node XDBC as described above.

When the read signal CBSC is activated (logic level "H") in this state (Tc3), since the first and second capacitors 222 and 224 are connected in parallel between the node XDBC and the ground potential level as described above, the potential decreases by V0/m as a result of distribution of charges.

Next, the column select signal CSL is activated (logic level "L") (Tc4), and the CPU bit line CPU-BL and the data line DBC are connected through the transmission gate 186. Since the potential on the CPU bit line CPU-BL gradually decreases as described above, the potential on the data line DEC also gradually decreases.

If the sense amplifier control signal SAON is activated (logic level "H") (Tc5), the output of the sense amplifier is switched when the potential on the data line DBC drops below the constant voltage at the node XDBC generated by the constant potential generation circuit 200 (Tc6).

Specifically, since the potential on the data line DBC drops below the potential at the node XDBC, the node ND1 transfers to the logic level "H", and the node XND1 transfers to the logic level "L". This turns off the P-type MOS transistor 212 to which the logic level at the node ND1 is input as it is, turns on the N-type MOS transistor 214 of the output buffer circuit 210 to which the signal that is an inversion of the logic level at the node XND1 is input, and sets the read data line RDB at the logic level "L". This is the same logic level as the logic level maintained in the memory cell MC.

Finally, the sense amplifier control signal SAON is set inactive (logic level "L") (Tc7), and the read control signal CBSC and the column select signal are set inactive (Tb8) to complete the series of reading operation.

As thus described, in the present embodiment, the potential which has been obtained by the conventional bit line /B is generated by the constant potential generation circuit 200, and the potential is compared with the potential on the bit line B. This makes it possible to increase the speed of data reading through the same bit lines. A display driver utilizing the same can perform processes such as rewriting of display data stored in memory cells for reversing by a CPU at a high speed, which makes it possible to display images based on more complicated display data.

3. Comparative Example

The display driver according to the present embodiment having a RAM area including memory cells having a configuration as described above will now be compared with a case in which bit lines B and /B are used for memory cells.

Figure 11:
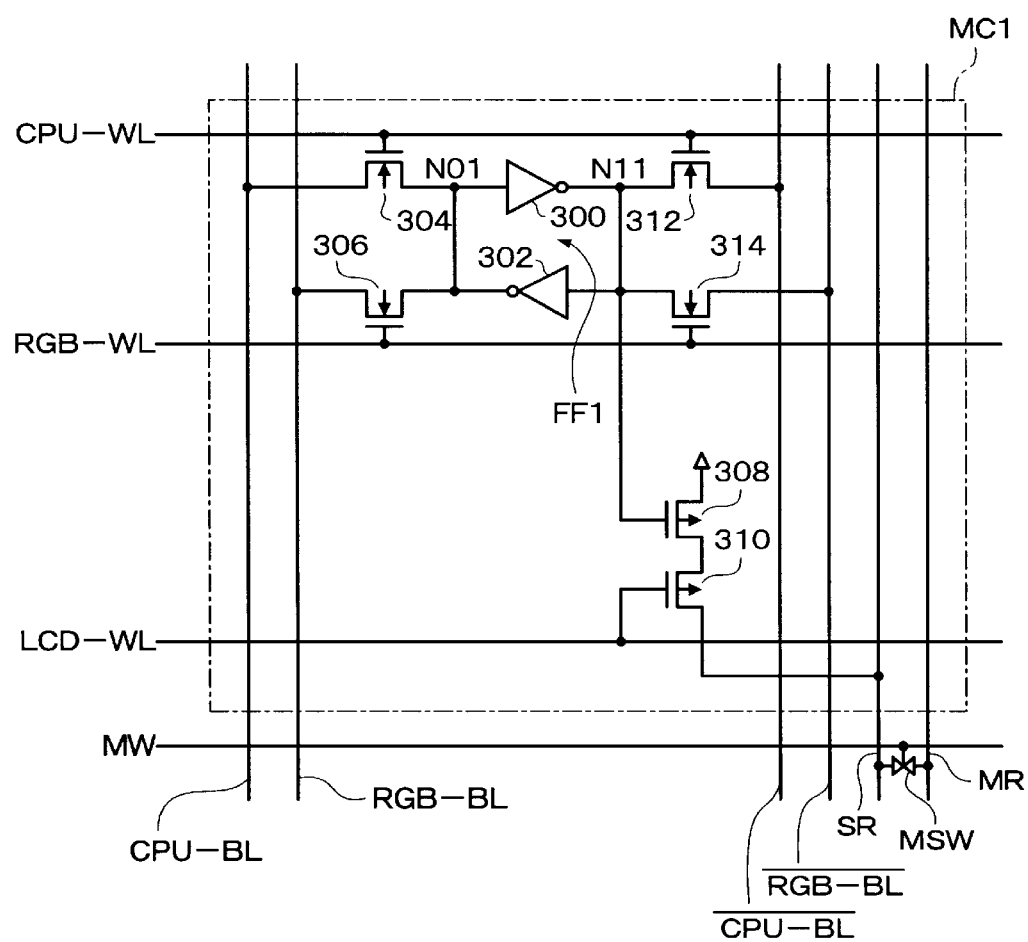
FIG. 11 is a circuit configuration diagram showing a configuration of a memory cell having three ports utilizing bit lines B and /B as a comparative example.

FIG. 11 shows a configuration of a memory cell having three ports utilizing bit lines B and /B.

A memory cell MC1 in this case is similar to the present embodiment in that it includes a flip-flop FF1 formed by connecting input and output terminals of third and fourth inverters 300 and 302 to each other and in that a node N01 is connected to a CPU bit line CPU-BL and an RGB bit line RGB-BL through N-type MOS transistors 304 and 306 as switching elements. It is similar to the present embodiment also in that a node N11 is connected to the gate terminal of a P-type MOS transistor 308 and is connected to a sub read line SR through a P-type MOS transistor 310 which is turned on when an LCD word line LCD-WL is activated.

It is different from the present embodiment in that the node N11 is connected to a CPU inverted bit line /CPU-BL which is paired with the CPU bit line CPU-BL through an N-type MOS transistor 312 which is turned on when the CPU word line CPU WL is activated and to an RGB inverted bit line /RGB-BL which is paired with the RGB bit line RGB-BL through an N-type MOS transistor 314 which is turned on when an RGB word line RGB-WL is activated.

Therefore, to maintain the logic level "L" at the node N01 of the flip-flop FF1 of the memory cell MC1, the N-type MOS transistor on either CPU bit line CPU-BL or RGB bit line RGB-BL is turned on to write the "L" potential on the bit line at the node N01. To maintain the logic level "H" at the node N01 of the flip-flop FF1, the N-type MOS transistor on either CPU inverted bit line /CPU-BL or RGB inverted bit line /RGB-BL is turned on to write the "L" potential on the bit line at the node N01, thereby setting the logic level "L" at the node N11 and the logic level "H" at the node N01. This makes it possible to maintain a preferable operational margin.

However, this means that six bit lines are provided within a lateral width of the memory cell MC1.

Figure 12A:
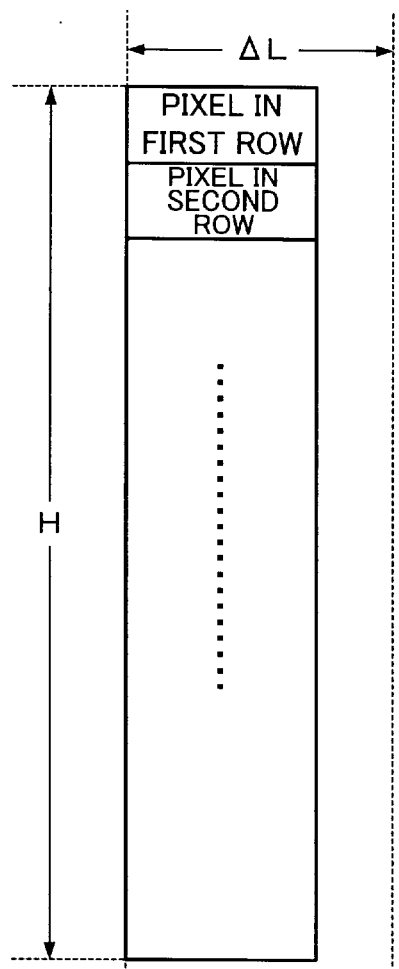
FIG. 12A shows an example of an arrangement of each pixel constituted by a memory cell having three ports utilizing bit lines B and /B.

Therefore, when such a memory cell MC1 is shrunk using a finer process, the cell size can not be sufficiently reduced in the light of the need for maintaining a certain line interval between the bit lines that is determined by the design rule. In the case of a display driver, it is required to provide memory cells in association with each pixel taking the method of driving into consideration. When one pixel is formed by display data having a plurality of bits, memory cells for two pixels can not be arranged in the word line direction as they are, and it has been possible only to provide a memory cell for one pixel within an interval ΔL between output electrodes, as shown in FIG. 12A.

Specifically, if it is assumed that one pixel has 64 (=$2^6$) gray scales, for example, when the display driver is manufactured with a 0.25 μm process and memory cells for storing display data with 18 bits for one pixel are formed within an interval ΔL associated with one output electrode, the effect of shrinking can not be sufficiently achieved unless the shrinking is performed using a 0.18 μm process to form memory cells for storing display data with 36 bits in total for two pixels within the interval ΔL.

In the memory cell MC of the present embodiment, the above-described configuration makes it possible to reduce the number of bit lines and to arrange memory cells for at least two pixels in the word line direction even when it is manufactured using a finer process.

Specifically, by reducing the number of bit lines provided in each memory cell, n×A (A is a natural number) memory cells can be arranged in the word line direction such that (n×LC)×A<ΔL where ΔL represents the interval between the output electrodes; n represents the number of bits of gray scale data per dot that forms a part of a pixel; and LC represents the pitch between the memory cells. The pitch LC of the memory cells may be the lateral width of the memory cells themselves, or the pitch may include a width required for providing control circuits for accessing the memory cells.

Figure 12B:
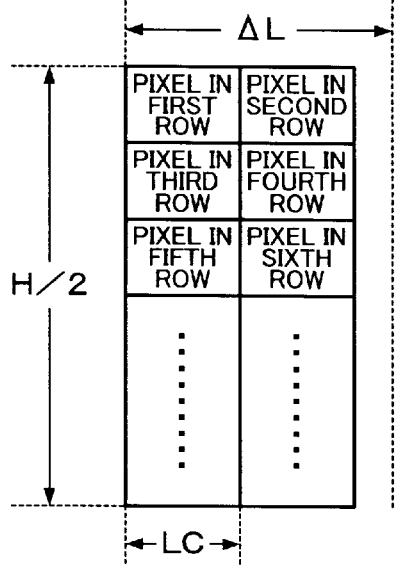
FIG. 12B shows an example of an arrangement of each pixel constituted by a memory cell according to the embodiment.

For example, when A is 2, a memory cell associated with a pixel in the first row and a memory cell associated with a pixel in the second row can be provided adjacently to each other in the word line direction within the interval ΔL, as shown in FIG. 12B. Therefore, the height of the RAM area in the bit line direction can be one half of the height H shown in FIG. 12A, which makes it possible to achieve a great reduction in chip size.

Further, such a configuration makes it possible to reduce power consumption associated with reading of memories by employing an order of memory reading specific to a display driver. Specifically, pixel data for the first row, second row, third row, and so on are sequentially read at constant cycles from one output electrode of a display driver. Therefore, when memory cells for at least two pixels are arranged adjacently to each other within the interval ΔL as described above, pixel data for a plurality of pixels can be simultaneously read by activating a single word line. The number of times the word line are driven can be reduced by latching the data at an output stage of the RAM area and sequentially outputting the data for each row.

Figure 13:
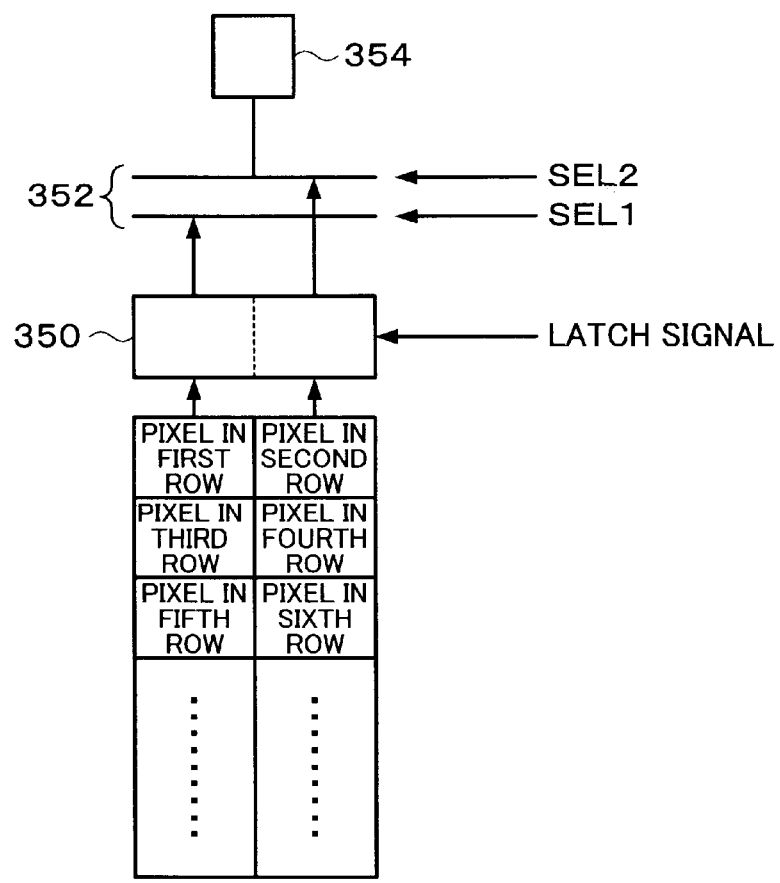
FIG. 13 is a block configuration diagram showing an example of a configuration of an output latch circuit in the RAM area of the embodiment.

FIG. 13 shows an example of a configuration of such an output latch circuit of a RAM area.

In this case, the output latch circuit is provided for each output electrode. The output circuit includes a latch circuit 350 for latching pixel data for two pixels and a selector circuit 352.

Figure 14:
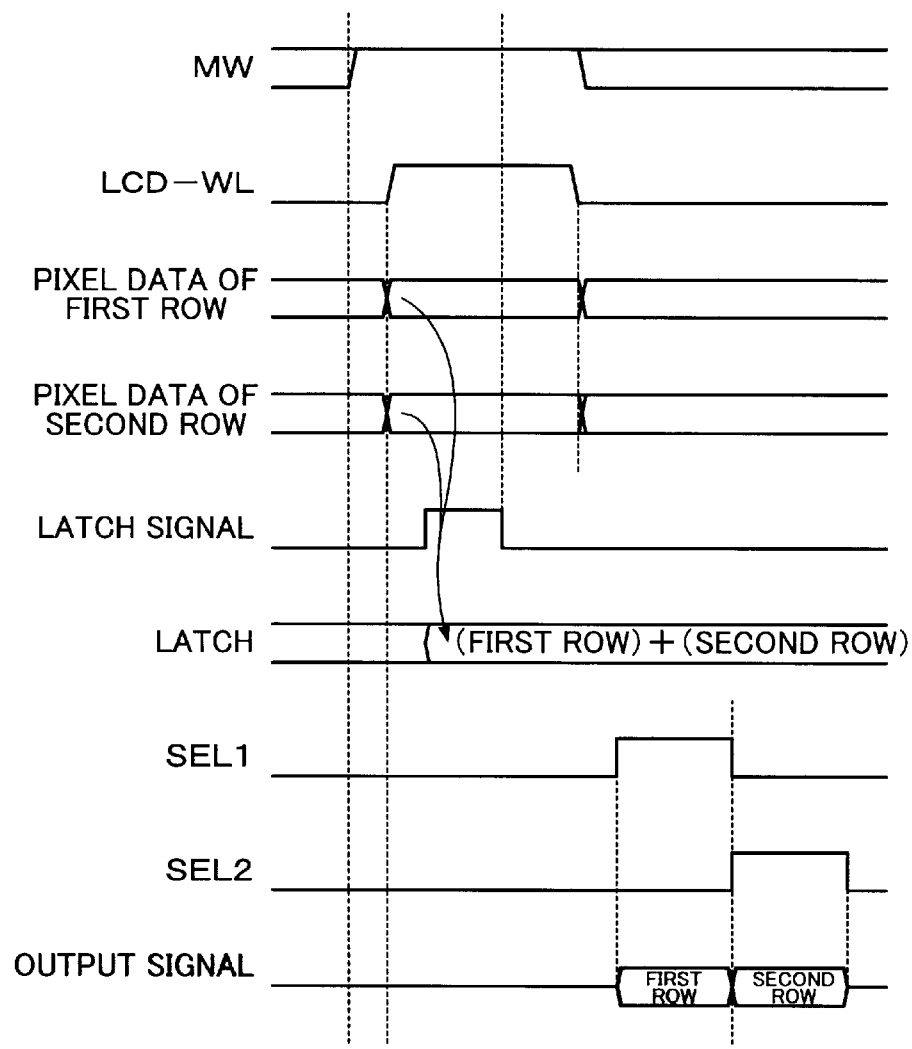
FIG. 14 is a timing chart showing an example of the timing of an operation of the output latch circuit in the RAM area of the embodiment.

FIG. 14 shows an example of the timing of an operation of the output latch circuit shown in FIG. 13.

The following description will refer to reading of pixel data for the first and second rows associated with a single output electrode. The description will equally apply to the third and later rows.

For example, a main word line MW and an LCD word line LCD-WL are activated in the same manner as shown in FIG. 7 to read data maintained in memory cells storing pixel data for the first and second rows. The pixel data for the first and second rows thus read are latched in the latch circuit 350 in synchronism with a latch signal.

Thereafter, the first and second rows are sequentially output from the latch circuit 350 using selector signals SEL1 and SEL2 generated based on display synchronization.

Since a display driver has a problem specific thereto in that the width L of the display driver is limited by the size of the display panel to be driven as described above, the interval ΔL which corresponds to an interval between pads of an output driver and the width of the RAM area are also limited because RAM control circuits, G/A, and the like are provided. On the other hand, memory cells in a quantity that is an integral multiple of the quantity according to the prior art must be provided in the direction in which output electrodes are arranged in order to use conventional methods of driving. For example, shrinking is performed by using a 0.18 μm process instead of a 0.25 μm process, it becomes more difficult to at least double the number of memory cells provided within the above-described interval ΔL.

Under such circumstances, in the display driver of the present embodiment, memory cells are improved as described above to allow memory cells for at least two pixels to be provided within the above-described interval ΔL even if three port memories capable of controlling input and output of still-image data and dynamic data separately and independently are used and bit lines are divided to reduce a load.

4. Example of Configuration of Display Driver IC

Figure 15:
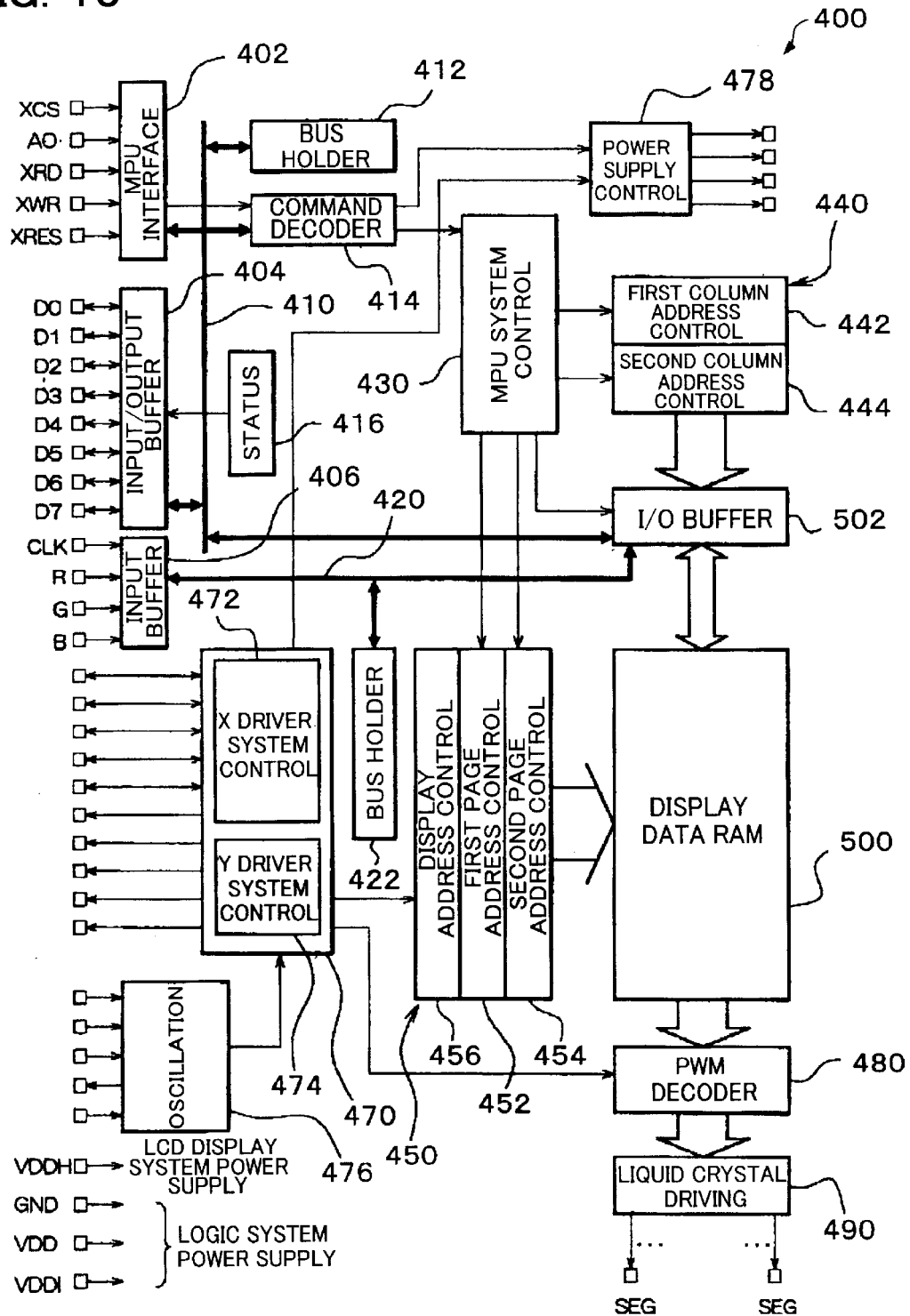
FIG. 15 is a block diagram of a display driver according to the embodiment used in an X driver IC.

FIG. 15 shows a block diagram of an application of the display driver of the present embodiment in an X driver IC.

This X driver IC 400 has a display data 500 with an RAM area including memory cells as described above.

An X driver IC 400 has a microprocessor unit (MPU) interface 402, an input/output buffer 404, and an input buffer 406 as input/output circuits.

An inverted chip select signal XCS, a command/data identification signal A0, an inverted read signal XRD, an inverted write signal XWR, an inverted reset signal XRES, and so on are input to the MPU interface 402.

For example, commands or still-image data D7 through D0 having eight bits are input to the input/output buffer 404. While FIG. 15 shows an example in which the signals D7 through D0 are input and output in parallel, the leading bit may be used as an identification signal A0, and the subsequent signals D7 through D0 may be serially input and output when there is no need for reading data from a display data RAM 500 in the X driver IC 400 to an external MPU including a CPU which is not shown. This makes it possible to reduce the number of terminals of the MPU and the X driver IC 400.

For example, moving-image data constituted by R, G, and B signals each having six bits and a clock signal CLK are input to the input buffer 406. The R, G, and B signals each having six bits are input and output in parallel in synchronism with the clock signal CLK.

The X driver IC 400 has a first bus line 410 connected to the MPU interface 402 and input/output buffer 404 and a second bus line 420 connected to the input buffer 406.

A bus holder 412 and a command decoder 414 are connected to the first bus line 410, and a bus holder 422 is connected to the second bus line 420. A status setting circuit 416 is connected to the input/output buffer 404, and states of operation of the X driver IC 400 are output to the MPU.

The first and second bus lines 410 and 420 are both connected to an I/O buffer 502 of the display data RAM 500 to transmit still-image data and moving-image data to be read and written from and in the display data RAM 500.

In addition to the above-described display data RAM 500 and I/O buffer 502, the X driver IC 400 includes an MPU system control circuit 430, a column address control circuit 440, a page address control circuit 450, a driver system control circuit 470, a PWM decoder circuit 480, a liquid crystal driving circuit 490, and so on.

The MPU system control circuit 430 controls read and write operations on the display data RAM 500 based on commands from the MPU input through the command decoder 414. The column address control circuit 440 and page address control circuit 450 are controlled by the MPU system control circuit 430.

In the present embodiment, the column address control circuit 440 has a first column address control circuit 442 for specifying the address of a column in which still-image data are to be written and the address of a column from which still-image and moving-image data are to be read and a second column address controller 444 for specifying the address of a column in which moving-image data are to be written. The first and second column address control circuits 442 and 444 control CPU bit lines CPU-BL, RGB bit lines RGB-BL, and LCD bit lines LCD-BL as described above.

The page address control circuit 450 has a first page address control circuit 452 for specifying the address of a page in which still-image data are to be written and the address of a page from which still-image and moving-image data are to be read and a second page address controller 454 for specifying the address of a page in which moving-image data are to be written. The first and second page address control circuits 452 and 454 control CPU word lines CPU-WL and RGB word lines RGB-WL as described above.

Although not shown in FIG. 15, a vertical synchronization signal Vsync and a horizontal synchronization signal Hsync from the MPU are input to the MPU system control circuit 430. The horizontal synchronization signal Hsync is used to set and reset counters provided in the second column address control circuit 444 and the second page address control circuit 454 in order to minimize display shifts and so on attributable to writing errors such as noises during the writing of moving-image data. The horizontal synchronization signal Hsync and vertical synchronization signal Vsync are used to return a column address and a page address to a starting address SA. A starting address SA is an address which is used in combination with an end address EA to identify a rectangular area that is specified as a moving-image display area.

The page address control circuit 450 includes a display address control circuit 456 which is controlled by a driver system control circuit 470 and which specifies an address to be displayed on each line. The display address control circuit 456 controls reading through the sub read lines SR and main read lines MR using the above-described LCD word lines LCD-WL and main word lines MW.

The driver system control circuit 470 includes an X driver system control circuit 472 and a Y driver system control circuit 474. The driver system control circuit 470 generates a gray scale control pulse GCP, a polarity inversion signal FR, a latch pulse LP, and so on based on outputs from an oscillation circuit 476 and controls the display address control circuit 456, a PWM decoder circuit 480, a power supply control circuit 478, and a Y driver IC which is not shown independently of the MPU system control circuit 430.

The PWM decoder circuit 480 latches data on each line read from the display data RAM 500 and outputs signal having pulse widths associated with gray scales in accordance with a polarity inverting period. The liquid crystal driving circuit 490 shifts a signal from the PWM.decoder circuit 480 to a voltage compliant with the voltage of an LCD display system and supplies the same to a segment electrode SEG of the liquid crystal panel to be driven.

With such an X driver IC 400, since still-image data and moving-image data can be asynchronously accessed when writing them in the display data RAM 500 without any concern about the timing for writing of each other, processing loads during data writing can be significantly reduced.

5. Electronic Apparatus Utilizing Display Driver

Figure 16:
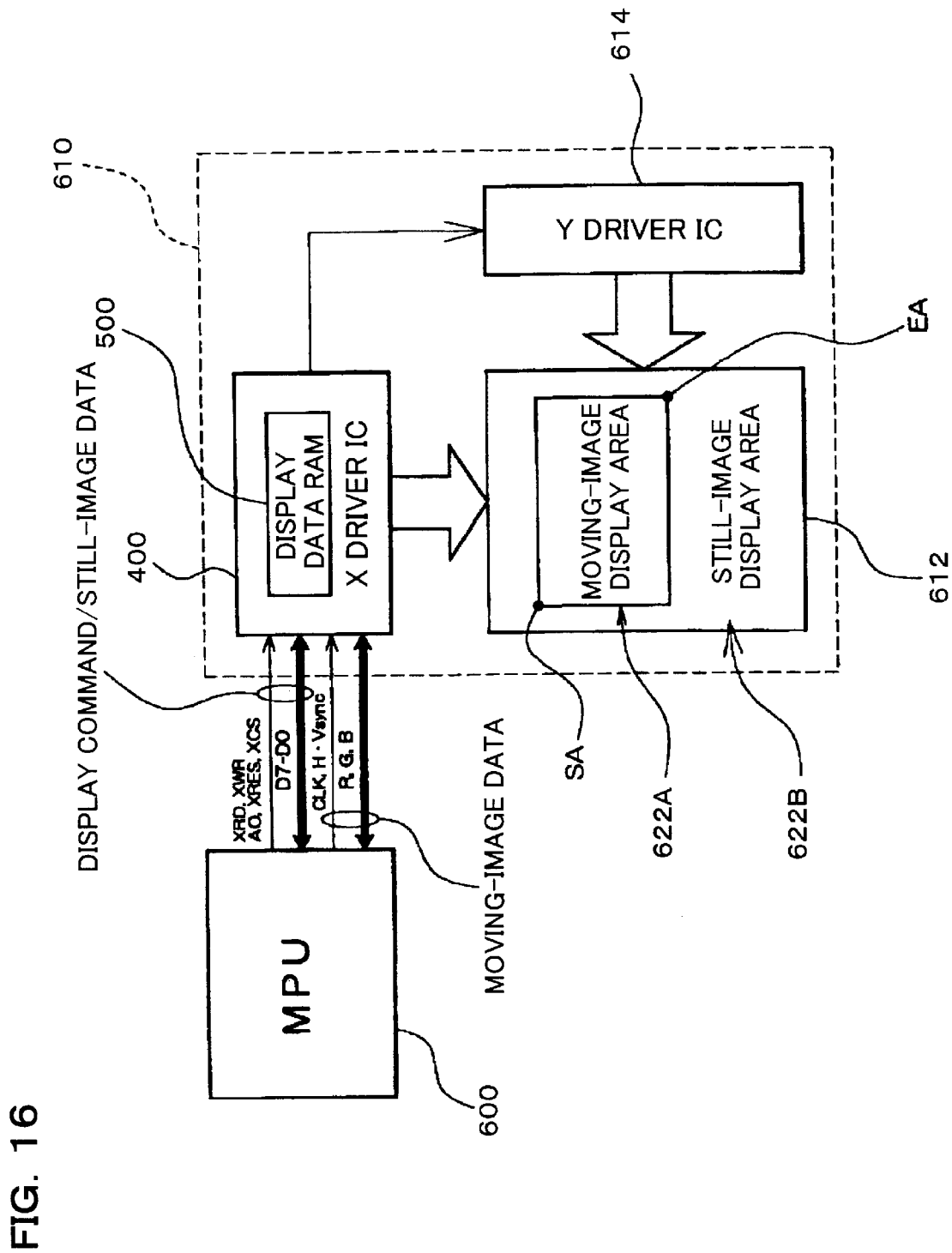
FIG. 16 is a schematic block diagram of an electronic apparatus in which an X driver IC according to the embodiment is used.

FIG. 16 shows a schematic block diagram of an electronic apparatus utilizing the X driver IC shown in FIG. 15.

The electronic apparatus is comprised of a CPU for writing and reading still-image data, an MPU 600 including a DSP for writing moving-image data, and a display unit 610.

The display unit 610 has a matrix panel having electro-optical elements, e.g., a color liquid crystal panel 612, an X driver IC 400 as described above for driving the liquid crystal panel 612, and a Y driver IC 614 for scanning.

The matrix panel 612 may be a part that utilizes electro-optical elements such as liquid crystals whose optical characteristics change as a result of application of a voltage. For example, the liquid crystal panel 612 maybe a simple matrix panel and, in this case, liquid crystals are enclosed between a first substrate having a plurality of segment electrodes (first electrodes) formed thereon and a second substrate having a common electrode (a second electrode) formed thereon. The liquid crystal panel 612 maybe an active matrix panel utilizing elements having three or two terminals such as thin-film transistors (TFTs) and thin-film diodes (TFDs). Such an active matrix panel also has a plurality of signal electrodes (first electrodes) driven by the X driver IC 400 and a plurality of scan electrodes (second electrodes) scanned by the Y driver IC 614.

A still-image and a moving-image can be simultaneously displayed on the liquid display panel 612. In this case, as shown in FIG. 16, a moving-image display area 622A which is defined by the size of an image and a still-image display area (a text data display area) 622B occupying the rest of the screen are set on the liquid crystal panel 612.

As shown in FIG. 16, generally speaking, display command/still-image data and moving-image data are supplied from the MPU 600 to the display unit 610. Typical display commands include a signal A0 that distinguishes a command from data, an inverted reset signal XRES, an inverted chip select signal XCS, an inverted read signal XRD, and an inverted write signal XWR. Data D7 through D0 are command data having eight bits (including address data for a still-image and a moving-image) or still-image data, the items of data being distinguished from each other by the logic of the command/data identification signal A0. For example, the moving-image data are R, G, and B signals each having six bits, and a clock signal CLK, a horizontal synchronization signal Hsync, a vertical synchronization signal Vsync, and so on may be supplied.

The MPU 600 first sets a starting address SA and an end address EA for identifying the moving-image display area 622A based on commands identified by such signals and thereafter writes still-image data and moving-image data in memory cells associated with the addresses thus set.

In the electronic apparatus having such a configuration, since the MPU 600 can write still-image data and moving-image data through separate ports, burdens on the MPU 600 can be significantly reduced, and the processing capacity can be allocated to other processes to allow processing at a higher speed.

Figure 17:
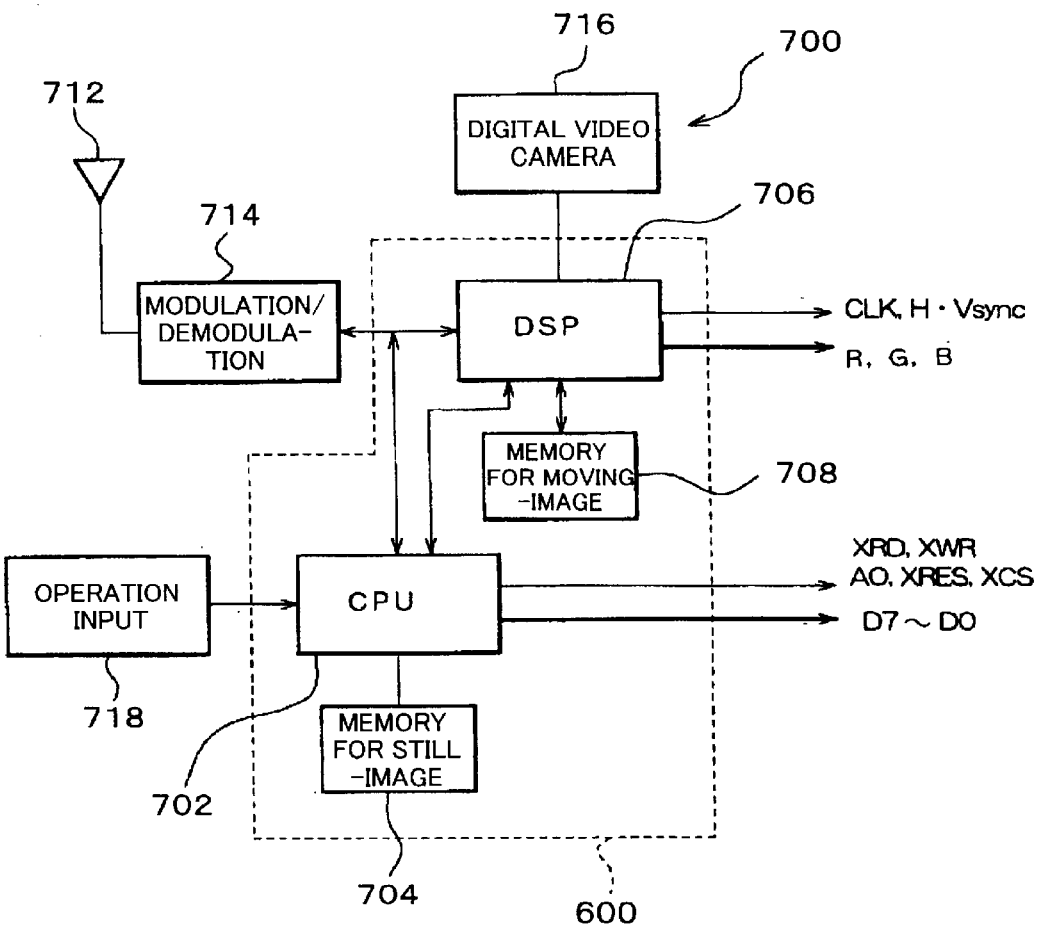
FIG. 17 is a general configuration diagram showing a general configuration of a portable telephone according to the embodiment.

FIG. 17 shows an example in which an MPU 600 and a display unit 610 as shown in FIG. 16 are incorporated in a portable telephone 700.

The MPU 600 has a CPU 702 which controls the portable telephone 700, and a memory 704 for a still-image and a DSP 706 are connected to the CPU 702. A memory 708 for a moving-image is connected to the DSP 706.

The portable telephone 700 is provided with a modulation/demodulation circuit 714 for demodulating a signal received through an antenna 712 or modulating a signal to be transmitted through the antenna 712. For example, moving-image data encoded according to the MPEG (Moving Picture Experts Group) specifications can be transmitted and received by the antenna 712.

For example, the portable telephone 700 may be provided with a digital video camera 716. Moving-image data can be acquired through the digital video camera 716. Operational information required to data transmission and reception using the portable telephone 700, photographing with the digital video camera 716, and so on is input through an operation input section 718.

Figure 18:
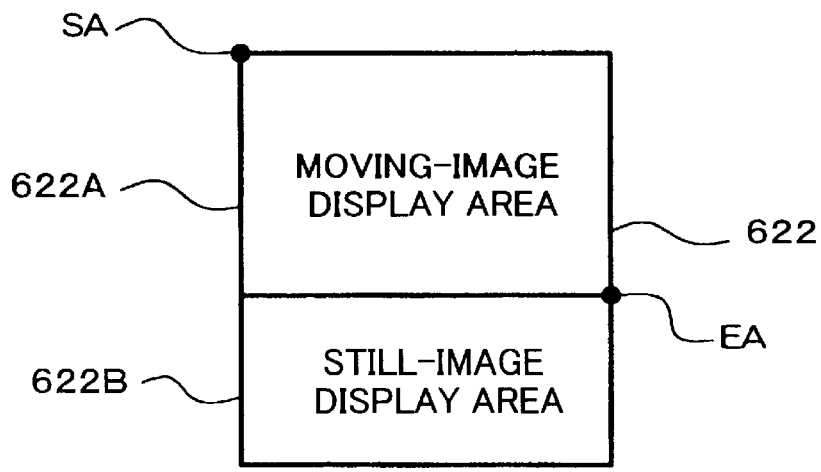
FIG. 18 is a schematic illustration showing an example of display that is different from the example of display of a liquid crystal panel shown in FIG. 16.

The CPU 702 provided in the MPU 600 determines the size of a moving-image to be displayed in the moving-image display area 622A of the liquid crystal panel 612 from moving-image information. Specifically, it determines a starting address SA and an end address EA for the moving-image as shown in FIG. 16. The moving-image display area 622A and still-image display area 622B may be separated from each other in the vertical direction along a line as shown in FIG. 18 and, in this case, a starting address SA and an end address EA for a moving-image are again determined based on the size of the image.

A moving-image displayed in the moving-image display area 622A is supplied from the antenna 712 or digital video camera 716 in the present embodiment. A signal input from the antenna 712 is demodulated by the modulation/demodulation circuit 714 and is subjected to signal processing ay the DSP 706. The DSP 706 is connected to the memory 708 for processing a moving-image to decompress compressed data input through the antenna 712 and modulation/demodulation circuit 714 or decode data that is encoded according to the MPEG layer IV specifications. Data to be transmitted through the modulation/demodulation circuit 714 and antenna 712 are compressed by the DSP 706 and are encoded when they are to be encoded for transmission according to the MPEG layer IV specifications. Thus, the DSP 706 may function as a decoder and an encoder according to the MPEG layer IV for example.

A signal from the digital video camera 716 is also input to the DSP 706, and a signal input from the antenna 712 or digital video camera 716 is processed by the DSP 706 into an RGB signal which is in turn supplied to the display unit 610.

The CPU 702 outputs commands and still-image data required to display a still-image on the liquid crystal panel 612 to the display unit 610 using the memory 704 for a still-image when needed based on information from the operation input section 718 and so on.

For example, the moving-image may be movie information distributed over the internet, and information required for reserving a ticket may be displayed as a still-image to allow a reservation for a ticket to be made based on information from the operation input section 718. For this purpose, the CPU 702 further controls transmission of still-image information (e.g., reservation information) through the modulation/demodulation circuit 714 and antenna 712. Further, the CPU 702 can control transmission of information on a moving-image taken by the digital video camera 716 through the modulation/demodulation circuit 714 and antenna 712.

Modification

The present embodiment is not limited to the configuration shown in FIG. 4. For example, the logic level "H" may be set at the node N0 using a set signal.

Figure 19:
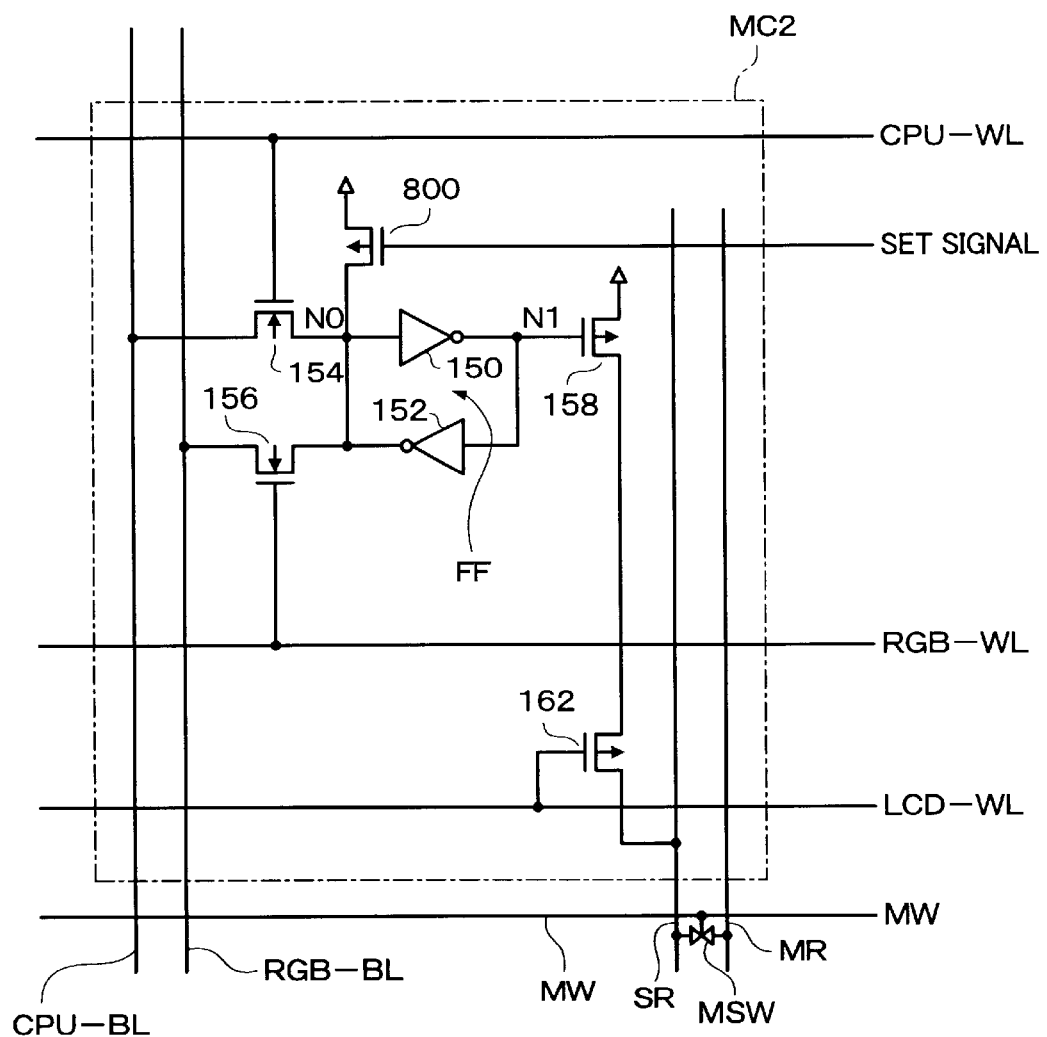
FIG. 19 is a circuit configuration diagram showing a general configuration of a memory cell in a modification of the embodiment.

FIG. 19 schematically shows a configuration of a memory cell according to a modification of the embodiment.

Parts identical to those of the memory cell of the embodiment shown in FIG. 4 are indicated by like reference numbers, and the description will appropriately omit them.

A memory cell MC2 according to the present modification is different from the memory cell MC of the embodiment shown in FIG. 4 in that the N-type MOS transistor 160 connected to the node N1 is deleted and in that the drain terminal of a P-type MOS transistor 800 is connected to the node N0.

The P-type MOS transistor 800 is connected to a power supply potential level at the source terminal thereof and is supplied with a set signal at the gate terminal thereof. The set signal is a signal that is an inversion of the set signal shown in FIG. 4.

With such a configuration, the node N0 can be electrically connected to the power supply potential level by turning the P-type MOS transistor 800 on. This eliminates problems associated with an operational margin during writing of data

What is claimed is:

1. A display driver incorporating a RAM formed of at least a plurality of memory cells provided for each pixel, each of the memory cells comprising:
   a flip-flop having first and second nodes which store logic levels complementary to each other;
   a first switching element which electrically connects a first bit line with the first node when a first word line becomes active;
   a second switching element which electrically connects a second bit line with the first node when a second word line becomes active;
   a setting circuit which sets the second node at a first logic level based on a set signal; and
   a circuit which outputs the logic level stored at the second node to a display read line based on a given read signal, the display driver comprising a set signal generation circuit which generates the set signal for each pixel, the set signal setting the second node at the first logic level for the memory cells for a pixel.

2. The display driver as defined in claim 1, wherein the set signal generation circuit generates the set signal for each pixel, the set signal becoming active on condition that a pulse signal of which level is varied per pixel writing and the first or second word line become active.

3. The display driver as defined in claim 2, comprising:
   a circuit which precharges the first bit line to a precharge potential prior to a read operation;
   a constant potential generation circuit which sets a given node at a constant potential lower than the precharge potential at least when a read operation is performed; and
   an output buffer circuit which compares a potential on the first bit line with a potential at the given node and outputs a signal at a logic level corresponding to the result of the comparison.

4. The display driver as defined in claim 3, wherein the constant potential generation circuit comprises first and second capacitors each of which is connected to the given node at one end,
   wherein another end of the first capacitor is connected to a ground potential,
   wherein another end of the second capacitor is connected to a potential equivalent to the precharge potential prior to a read operation and is connected to the ground potential at least when a read operation is performed.

5. The display driver as defined in claim 2,
   wherein n×A (A is a natural number) pieces of the memory cells are arranged in the row direction such that $(n \times LC) \times A < \Delta L$ is satisfied where n represents the number of bits of gray scale data per dot; $\Delta L$ represents a pitch of output electrodes which output display data; and LC represents a pitch of the memory cells.

6. The display driver as defined in claim 5, further comprising:
   a latch circuit which latches display data read by activating a word line connected to each of n×A pieces of the memory cells arranged in the row direction; and
   a selector circuit which sequentially and selectively outputs display data for each pixel latched in the latch circuit.

7. A display unit comprising:
   a panel having an electro-optical element driven by a plurality of first electrodes and a plurality of second electrodes;
   the display driver as defined in claim 2 which drives the plurality of first electrodes; and
   a scan driver which scans the plurality of second electrodes.

8. An electronic apparatus comprising:
   the display unit as defined in claim 7; and
   an MPU which supplies a command, still-image data, and moving-image data to the display unit.

9. The display driver as defined in claim 1, comprising:
   a circuit which precharges the first bit line to a precharge potential prior to a read operation;
   a constant potential generation circuit which sets a given node at a constant potential lower than the precharge potential at least when a read operation is performed; and
   an output buffer circuit which compares a potential on the first bit line with a potential at the given node and outputs a signal at a logic level corresponding to the result of the comparison.

10. The display driver as defined in claim 9,
    wherein the constant potential generation circuit comprises first and second capacitors each of which is connected to the given node at one end,
    wherein another end of the first capacitor is connected to a ground potential,
    wherein another end of the second capacitor is connected to a potential equivalent to the precharge potential prior to a read operation and is connected to the ground potential at least when a read operation is performed.

11. The display driver as defined in claim 9,
    wherein n×A (A is a natural number) pieces of the memory cells are arranged in the row direction such that $(n \times LC) \times A < \Delta L$ is satisfied where n represents the number of bits of gray scale data per dot; $\Delta L$ represents a pitch of output electrodes which output display data; and LC represents a pitch of the memory cells.

12. The display driver as defined in claim 11, further comprising:
    a latch circuit which latches display data read by activating a word line connected to each of n×A pieces of the memory cells arranged in the row direction; and
    a selector circuit which sequentially and selectively outputs display data for each pixel latched in the latch circuit.

13. A display unit comprising:
    a panel having an electro-optical element driven by a plurality of first electrodes and a plurality of second electrodes;

the display driver as defined in claim 9 which drives the plurality of first electrodes; and a scan driver which scans the plurality of second electrodes.

14. An electronic apparatus comprising:

the display unit as defined in claim 13; and an MPU which supplies a command, still-image data, and moving-image data to the display unit.

15. The display driver as defined in claim 1, wherein the memory cells are arranged for each pixel in the row direction, wherein the display read line is provided for each memory cell in the column direction, the memory cells being divided into given blocks, the display read line transmitting display data read from one of the memory cells, the display driver further comprising:

a plurality of display word lines which sequentially select the memory cells for each pixel along the column direction;

a main read line shared by the memory cells in the column direction which transmits the display data read from the memory cells sequentially selected by the plurality of display word lines; and a plurality of main switches which connect the display read line provided at each of the blocks with the main read line.

16. The display driver as defined in claim 1, wherein n×A (A is a natural number) pieces of the memory cells are arranged in the row direction such that $$(n \times LC) \times A < \Delta L$$

is satisfied where n represents the number of bits of gray scale data per dot; $\Delta L$ represents a pitch of output electrodes which output display data; and LC represents a pitch of the memory cells.

17. The display driver as defined in claim 16, further comprising:

a latch circuit which latches display data read by activating a word line connected to each of n×A pieces of the memory cells arranged in the row direction; and a selector circuit which sequentially and selectively outputs display data for each pixel latched in the latch circuit.

18. A display unit comprising:

a panel having an electro-optical element driven by a plurality of first electrodes and a plurality of second electrodes;

the display driver as defined in claim 1 which drives the plurality of first electrodes; and a scan driver which scans the plurality of second electrodes.

19. An electronic apparatus comprising:

the display unit as defined in claim 18; and an MPU which supplies a command, still-image data, and moving-image data to the display unit.

20. A display drive circuit including a RAM formed of at least a plurality of memory cells provided for each pixel, each of the memory cells comprising:

a flip-flop having first and second nodes which store logic levels complementary to each other;

a first switching element which electrically connects a first bit line with the first node when a first word line becomes active;

a second switching element which electrically connects a second bit line with the first node when a second word line becomes active;

a setting circuit which sets the second node at a first logic level based on a set signal; and a circuit which outputs the logic level stored at the second node to a display read line based on a given read signal, the display driver comprising a set signal generation circuit which generates the set signal for each pixel, the set signal setting the second node at the first logic level for the memory cells for a pixel.

21. A display driver having a plurality of memory cells, each of the memory cells comprising:

means for storing logic levels complementary to each other;

means for electrically connecting a first bit line with a first node when a first word line becomes active;

means for electrically connecting a second bit line with the first node when a second word line becomes active;

means for setting a second node at a first logic level based on a set signal; and means for outputting the logic level stored at the second node to a display read line based on a given read signal, the display driver comprising means for generating the set signal for each pixel, the set signal setting the second node at the first logic level for the memory cells for a pixel.

22. The display driver as defined in claim 21, wherein the means for generating generates the set signal for each pixel, the set signal becoming active on condition that a pulse signal of which level is varied per pixel writing and the first or second word line become active.

23. The display driver as defined in claim 22, further comprising:

means for precharging the first bit line to a precharge potential prior to a read operation;

means for setting a given node at a constant potential lower than the precharge potential at least when a read operation is performed; and means for comparing a potential on the first bit line with a potential at the given node and outputting a signal at a logic level corresponding to the result of the comparison.

24. The display driver as defined in claim 23, wherein the means for setting a given node at a constant potential comprises first and second capacitors each of which is connected to the given node at one end, wherein another end of the first capacitor is connected to a ground potential, wherein another end of the second capacitor is connected to a potential equivalent to the precharge potential prior to a read operation and is connected to the ground potential at least when a read operation is performed.

25. The display driver as defined in claim 22, wherein n×A (A is a natural number) pieces of the memory cells are arranged in the row direction such that $$(n \times LC) \times A < \Delta L$$

is satisfied where n represents the number of bits of gray scale data per dot; $\Delta L$ represents a pitch of output electrodes which output display data; and LC represents a pitch of the memory cells.

26. The display driver as defined in claim 25, further comprising:

means for latching display data read by activating a word line connected to each of n×A pieces of the memory cells arranged in the row direction; and means for sequentially and selectively outputting display data for each pixel latched in the means for latching.

27. The display driver as defined in claim 21, further comprising:

means for precharging the first bit line to a precharge potential prior to a read operation;

means for setting a given node at a constant potential lower than the precharge potential at least when a read operation is performed; and means for comparing a potential on the first bit line with a potential at the given node and outputting a signal at a logic level corresponding to the result of the comparison.

28. The display driver as defined in claim 27, wherein the means for setting a given node at a constant potential comprises first and second capacitors each of which is connected to the given node at one end, wherein another end of the first capacitor is connected to a ground potential, where in another end of the second capacitor is connected to a potential equivalent to the precharge potential prior to a read operation and is connected to the ground potential at least when a read operation is performed.

29. The display driver as defined in wherein n×A (A is a natural number) pieces of the memory cells are arranged in the row direction such that $$(n \times LC) \times A < \Delta L$$

is satisfied where n represents the number of bits of gray scale data per dot; ΔL represents a pitch of output electrodes which output display data; and LC represents a pitch of the memory cells.

30. The display driver as defined in claim 29, further comprising:

means for latching display data read by activating a word line connected to each of n×A pieces of the memory cells arranged in the row direction; and means for sequentially and selectively outputting display data for each pixel latched in the means for latching.

31. The display driver as defined in claim 21, wherein the memory cells are arranged for each pixel in the row direction, wherein the display read line is provided for each memory cell in the column direction, the memory cells being divided into given blocks, the display read line transmitting display data read from one of the memory cells, the display driver further comprising:

a plurality of display word lines which sequentially select the memory cells for each pixel along the column direction;

a main read line share by the memory cells in the column direction which transmits the display data read from the memory cells sequentially selected by the plurality of display word lines; and a plurality of main switches which connect the display read line provided at each of the blocks with the main read line.

32. The display driver as defined in claim 21, wherein n×A (A is a natural number) pieces of the memory cells are arranged in the row direction such that $$(n \times LC) \times A < \Delta L$$

is satisfied where n represents the number of bits of gray scale data per dot; ΔL represents a pitch of output electrodes which output display data; and LC represents a pitch of the memory cells.

33. The display driver as defined in claim 28, further comprising:

means for latching display data read by activating a word line connected to each of n×A pieces of the memory cells arranged in the row direction; and means for sequentially and selectively outputting display data for each pixel latched in the means for latching.

34. A method for providing a display driver with a plurality of memory cells comprising:

storing logic levels complementary to each other;

electrically connecting a first bit line with a first node when a first word line becomes active;

electrically connecting a second bit line with the first node when a second word line becomes active;

setting a second node at a first logic level based on a set signal; and outputting the logic level stored at the second node to a display read line based on a given read signal; and generating the set signal for each pixel, the set signal setting the second node at the first logic level for the memory cells for a pixel.

35. The method as defined in claim 34, further comprising generating the set signal for each pixel, the set signal becoming active on condition that a pulse signal of which level is varied per pixel writing and the first or second word line become active.

36. The method as defined in claim 35, further comprising:

precharging the first bit line to a precharge potential prior to a read operation;

setting a given node at a constant potential lower than the precharge potential at least when a read operation is performed; and comparing a potential on the first bit line with a potential at the given node and outputting a signal at a logic level corresponding to the result of the comparison.

37. The method as defined in claim 34, further comprising:

precharging the first bit line to a precharge potential prior to a read operation;

setting a given node at a constant potential lower than the precharge potential at least when a read operation is performed; and comparing a potential on the first bit line with a potential at the given node and outputting a signal at a logic level corresponding to the result of the comparison.

* * * * *